(12) United States Patent
Xie et al.

(10) Patent No.: US 12,080,714 B2
(45) Date of Patent: Sep. 3, 2024

(54) BURIED LOCAL INTERCONNECT BETWEEN COMPLEMENTARY FIELD-EFFECT TRANSISTOR CELLS

(71) Applicant: International Business Machines Corporation, Armonk, NY (US)

(72) Inventors: Ruilong Xie, Niskayuna, NY (US); Reinaldo Vega, Mahopac, NY (US); Alexander Reznicek, Troy, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 17/447,944

(22) Filed: Sep. 17, 2021

(65) Prior Publication Data

US 2023/0089185 A1    Mar. 23, 2023

(51) Int. Cl.
| | |
|---|---|
| *H01L 29/775* | (2006.01) |
| *H01L 21/8234* | (2006.01) |
| *H01L 23/538* | (2006.01) |
| *H01L 27/092* | (2006.01) |
| *H01L 27/12* | (2006.01) |

(52) U.S. Cl.
CPC .... *H01L 27/092* (2013.01); *H01L 21/823431* (2013.01); *H01L 23/5386* (2013.01); *H01L 27/1218* (2013.01); *H01L 27/127* (2013.01)

(58) Field of Classification Search
None
See application file for complete search history.

(56) References Cited

U.S. PATENT DOCUMENTS

| | | | |
|---|---|---|---|
| 9,685,436 B2 | 6/2017 | Morrow et al. | |
| 9,711,501 B1 | 7/2017 | Basker et al. | |
| 10,192,819 B1 | 1/2019 | Chanemougame et al. | |
| 10,192,867 B1 | 1/2019 | Frougier et al. | |
| 10,510,622 B1 | 12/2019 | Frougier et al. | |
| 10,879,308 B1 * | 12/2020 | Ando | H10B 63/845 |
| 2019/0131394 A1 * | 5/2019 | Reznicek | H01L 21/30604 |
| 2019/0172755 A1 | 6/2019 | Smith et al. | |
| 2019/0326286 A1 * | 10/2019 | Xie | H01L 29/401 |

(Continued)

OTHER PUBLICATIONS https://vlsisymposium.org/2018/press-2/, "2018 Symposia on VLSI Technology and Circuits", VLSI 2018 | Media—VLSI 2018, Accessed on Mar. 11, 2021, 2 pages.

(Continued)

*Primary Examiner* — Bilkis Jahan
(74) *Attorney, Agent, or Firm* — Stosch Sabo

(57) ABSTRACT

An integrated circuit component includes a first layer including first and second areas of epitaxy material. The first layer has a first polarity. The component further includes a second layer including third and fourth areas of epitaxy material. The second layer has a second polarity that is different than the first polarity. The third area is arranged at least partially above the first area, and the fourth area is arranged at least partially above the second area. The integrated circuit component further includes an interconnect in direct contact with one of the first area and the third area and in direct contact with one of the second area and the fourth area. The interconnect has a top surface that does not extend substantially above an uppermost surface of the second layer.

20 Claims, 30 Drawing Sheets

(56) References Cited

U.S. PATENT DOCUMENTS

2020/0127054 A1* 4/2020 Ando .................. H10N 70/021
2021/0233960 A1* 7/2021 Ando .................... H10N 70/24
2022/0052258 A1* 2/2022 Cheng ............... H10N 70/8833

OTHER PUBLICATIONS

Ryckaert et al., "Enabling Sub-5nm CMOS Technology Scaling Thinner and Taller!," International Electron Devices Meeting, IEDM, 2019, pp. 29.4.1-29.4.4.
Ryckaert et al., "The Complementary FET (CFET) for CMOS scaling beyond N3", 2018 Symposium on VLSI Technology Digest of Technical Papers, pp. 141-142.

* cited by examiner

BURIED LOCAL INTERCONNECT BETWEEN COMPLEMENTARY FIELD-EFFECT TRANSISTOR CELLS

BACKGROUND

The present disclosure relates to the electrical, electronic, and computer fields. In particular, the present disclosure relates to interconnects between field-effect-transistors of semiconductor devices and methods of making the same.

SUMMARY

Embodiments of the present disclosure include an integrated circuit component. The integrated circuit component includes a first layer including a first area of epitaxy material and a second area of epitaxy material. The first layer has a first polarity. The integrated circuit component further includes a second layer including a third area of epitaxy material and a fourth area of epitaxy material. The second layer has a second polarity that is different than the first polarity. The third area of epitaxy material is arranged at least partially above the first area of epitaxy material, and the fourth area of epitaxy material is arranged at least partially above the second area of epitaxy material. The integrated circuit component further includes an interconnect in direct contact with one of the first area and the third area of epitaxy material and in direct contact with one of the second area and the fourth area of epitaxy material. The interconnect has a top surface that does not extend substantially above an uppermost surface of the second layer.

Additional embodiments of the present disclosure include a method of making an integrated circuit component. The method includes forming a first layer of epitaxy material. The first layer includes a first area and a second area. The method further includes forming a second layer of epitaxy material. The second layer includes a third area arranged at least partially above the first area and a fourth area arranged at least partially above the second area. The method further includes forming a trench between the first area and the second area and between the third area and the fourth area. The method further includes forming a contact in the trench such that the contact is in direct contact with one of the first area and the third area and is in direct contact with one of the second area and the fourth area.

Additional embodiments of the present disclosure include an integrated circuit component. The integrated circuit component includes a first layer of field-effect transistors having a first polarity. The integrated circuit component includes a second layer of field effect transistors stacked on top of the first layer of field-effect transistors. The second layer of field-effect transistors have a second polarity that is different than the first polarity. The integrated circuit component includes an interconnect in direct contact with one of the field-effect transistors of the first layer and in direct contact with one of the field-effect transistors of the second layer, wherein the interconnect does not extend above the second layer of field effect transistors.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Figure 1:
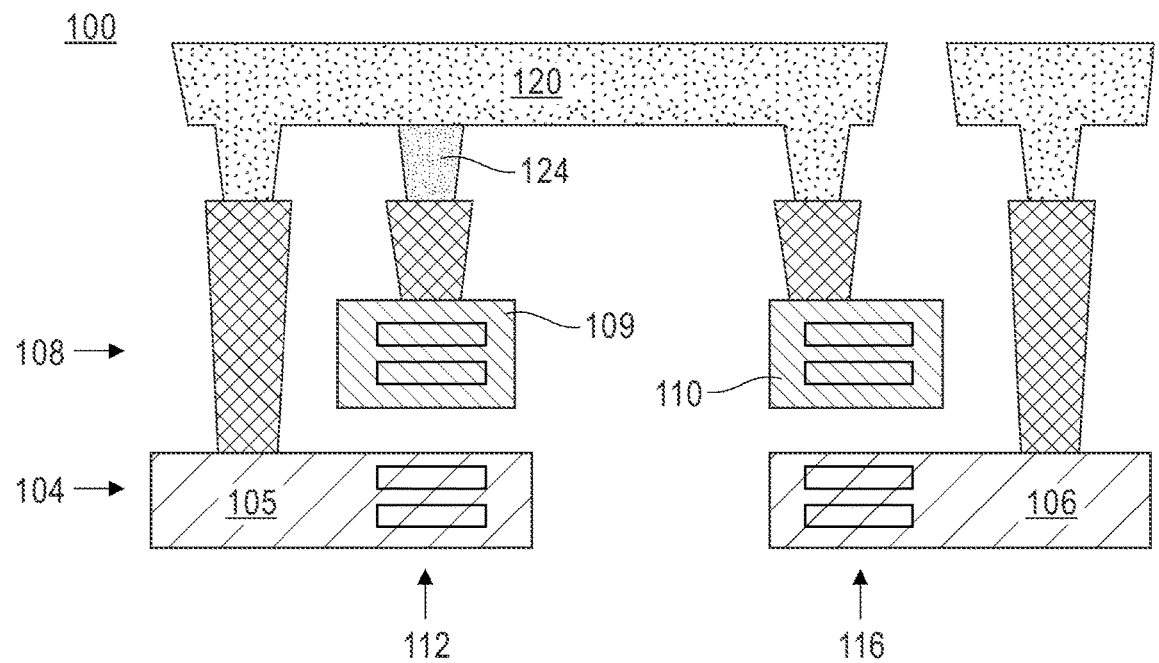
FIG. 1 illustrates a schematic drawing of an example of a complementary field-effect transistor (CFET), in accordance with embodiments of the present disclosure.

Aspects of the present disclosure relate generally to the electrical, electronic, and computer fields. In particular, the present disclosure relates to semiconductor devices. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For purposes of the description hereinafter, when a first surface is referred to as being arranged "opposite" to a second surface, the first surface is different from the second surface, and the first surface is spaced apart from the second surface. For instances in which the surfaces are substantially planar, the first surface is substantially parallel to the second surface.

Turning now to an overview of technologies that are more specifically relevant to aspects of the present disclosure, an integrated circuit (IC) is a set of electronic circuits on one small flat piece (or "chip") of semiconductor material. More specifically, large numbers of tiny transistors can be integrated into a small chip, and interconnects can be used to connect two or more circuit elements (such as transistors) on the chip together electrically. This results in circuits that are orders of magnitude smaller, faster, and less expensive than those constructed of discrete electronic components.

The field-effect transistor (FET) is a type of transistor that uses an electric field to control the flow of current in a semiconductor. FETs are devices with three terminals: a source, a gate, and a drain. FETs control the flow of current by the application of a voltage to the gate, which in turn alters the conductivity between the drain and source. More specifically, the FET controls the flow of electrons (or holes) from the source to drain by affecting the size and shape of a conductive channel created and influenced by voltage (or lack of voltage) applied across the gate and source terminals. (For simplicity, this discussion assumes that the body and source are connected.) This conductive channel is the stream through which electrons flow from source to drain.

FETs are also known as unipolar transistors since they involve single-carrier-type operation. In other words, a FET uses either electrons or holes as charge carriers in its operation, but not both. The source/drain of a FET is doped to produce either an n-type semiconductor (in which case the FET can be referred to as an NFET) or a p-type semiconductor (in which case the FET can be referred to as a PFET). When the voltage applied to the gate of the FET is larger than the threshold voltage, the charge carriers in the channel region of the FET are built up, which activates the FET (e.g., allowing current to flow between the source and the drain).

Many different types of field effect transistors exist. A gate-all-around (GAA) FET is a non-planar (3D) transistor designed such that the gate material surrounds the channel region on all sides. Accordingly, the contact between the gate and the channel is increased, which provides better electrical control over the channel. A GAAFET can be a PFET or an NFET. A gate-all-around n-type semiconductor may also be referred to herein as a GAA NFET. Similarly, a gate-all-around p-type semiconductor may also be referred to herein as a GAA PFET.

A complementary field-effect transistor (CFET) utilizes GAAFETs vertically stacked on top of one another to reduce the amount of space required to accommodate multiple transistors. In particular, in a CFET, GAAFETs of opposite polarity are vertically stacked on top of one another. For example, a GAA PFET can be vertically stacked on top of an GAA NFET, or a GAA NFET can be vertically stacked on top of a GAA PFET.

Once stacked, a pair including a GAA PFET and an GAA NFET can be functionally interconnected and utilized as a complementary metal-oxide-semiconductor (CMOS) cell. In a CMOS cell, complementary pairs of PFETs and NFETs are used for logic functions.

One benefit of CFET technology is that stacking transistors can permit smaller scale devices. However, interconnecting stacked transistors and CMOS cells can become complicated and congested, which can lead to reliability issues and/or may require additional space to accommodate interconnection structures.

For example, as shown in FIG. 1, a CFET arrangement 100 includes a bottom FET layer 104 and a top FET layer 108. Each of the bottom FET layer 104 and the top FET layer 108 includes FET areas of a source/drain epitaxy material, which surround the source or drain channel regions. In particular, the bottom FET layer 104 includes a left FET portion 105, which includes an area of the source/drain epitaxy material and the surrounded source or drain channel regions of a respective FET, and a right FET portion 106, which includes an area of the source/drain epitaxy material and the surrounded source or drain channel regions of a respective FET. Similarly, the top FET layer 108 includes a left FET portion 109 and a right FET portion 110, each of which corresponds to a respective FET.

In the example shown in FIG. 1, the bottom FET layer 104 is a layer of PFETs, and the top FET layer 108 is a layer of NFETs. Together, the left FET portion 105 of the bottom FET layer 104 and the left FET portion 109 of the top FET layer 108 make up a first CMOS cell 112. Similarly, the right FET portion 106 of the bottom FET layer 104 and the right FET portion 110 of the top FET layer 108 make up a second CMOS cell 116. In alternative embodiments, the polarities of the bottom and top FET layers 104, 108 can be reversed, but must remain opposite to one another.

Functionally interconnecting the first CMOS cell 112 to the second CMOS cell 116, or either of the CMOS cells to another CMOS cell in the chip, requires physical connections to be established. In the example shown in FIG. 1, to connect the first CMOS cell 112 to the second CMOS cell 116, the left FET portion 105 of the bottom FET layer 104 is connected to the right FET portion 110 of the top FET layer 108 by an interconnect 120 that extends from the bottom FET layer 104 above the height of the top FET layer 108. The additional space above the top FET layer 108 is required in this arrangement to enable the interconnection to be extended laterally from the left (where the first CMOS cell 112 is located) to the right (where the second CMOS cell 116 is located) without interfering with other structures and interconnects. For example, the interconnect 124 to the first CMOS cell 112 is not in the same plane as the interconnection 120, because the interconnect 124 must be arranged to avoid interference or intersection with other interconnects to the first CMOS cell 112.

Accordingly, this required space in middle-of-line (MOL) or back-end-of-line (BEOL) applications presents a limitation in the scalability of CFET technology. Moreover, considering the vast number of such connections to be established between the transistors and CMOS cells, avoiding interference or intersection of interconnects becomes increasingly complicated, which presents another limitation in the scalability of CFET technology.

Embodiments of the present disclosure may overcome these and other drawbacks of existing solutions by providing a buried local interconnect, which greatly reduces design congestion and enables a further reduction in height of the CFET.

Figure 2:
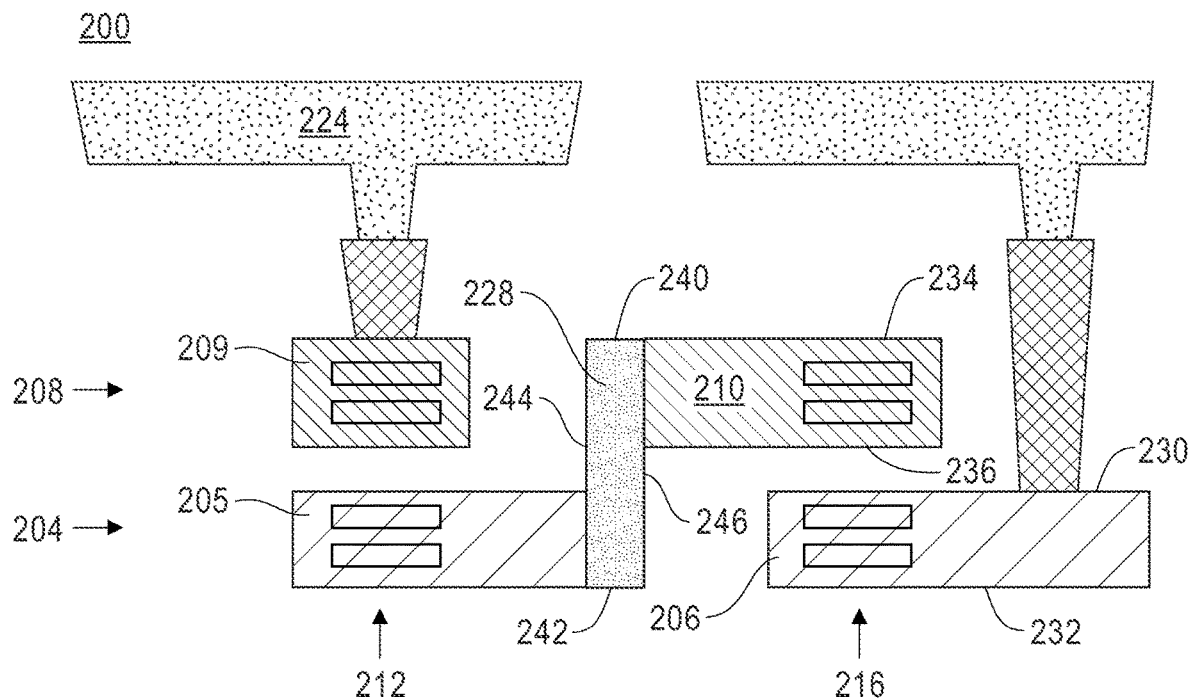
FIG. 2 illustrates a schematic drawing of another example of a CFET, in accordance with embodiments of the present disclosure.

An example of a CFET arrangement 200 according to embodiments of the present disclosure is shown in FIG. 2. Like the CFET arrangement 100, the CFET arrangement 200 includes a bottom FET layer 204 and a top FET layer 208 arranged such that a left FET portion 205 of the bottom FET layer 204 and a left FET portion 209 of the top FET layer 208 make up a first CMOS cell 212 and such that a right FET portion 206 of the bottom FET layer 204 and a right FET portion 210 of the top FET layer 208 make up a second CMOS cell 216.

However, unlike the CFET arrangement 100, the CFET arrangement 200 includes a buried local interconnect 228, which establishes a functional connection between the first CMOS cell 212 and the second CMOS cell 216 without extending above the height of the top FET layer 208. In the particular embodiment shown in FIG. 2, the interconnect 228 connects the left FET portion 205 of the bottom FET layer 204 and the right FET portion 210 of the top FET layer 208. However, in alternative embodiments, the interconnect 228 may connect different structures of the first CMOS cell 212 and the second CMOS cell 216. In all embodiments, because the interconnect 228 does not have to extend above the top FET layer 208, interference or intersection with other interconnects, such as interconnect 224, is avoided without complication and congestion above the top FET layer 208.

More specifically, in the CFET arrangement 200, the left FET portion 209 of the top FET layer 208 is arranged at least partially above the left FET portion 205 of the bottom FET layer 204. In other words, the left FET portion 209 of the top FET layer 208 and the left FET portion 205 of the bottom FET layer 204 are at least partially vertically aligned with one another such that, in a top plan view, at least some portion of the left FET portion 209 of the top FET layer 208 overlaps with at least some portion of the left FET portion 205 of the bottom FET layer 204. In at least one embodiment of the present disclosure, the left FET portions 209 and 205 may be substantially directly vertically aligned with one another. In at least one alternative embodiment of the present disclosure, the left FET portions 209 and 205 may be substantially offset vertically from one another but still include at least some area that is vertically aligned or overlapping.

Similarly, the right FET portion 210 of the top FET layer 208 is arranged at least partially above the right FET portion 206 of the bottom FET layer 204. In other words, the right FET portion 210 of the top FET layer 208 and the right FET portion 206 of the bottom FET layer 204 are at least partially vertically aligned with one another such that, in a top plan view, at least some portion of the right FET portion 210 of the top FET layer 208 overlaps with at least some portion of the right FET portion 206 of the bottom FET layer 204. In at least one embodiment of the present disclosure, the right FET portions 210 and 206 may be substantially directly vertically aligned with one another. In at least one alternative embodiment of the present disclosure, the right FET portions 210 and 206 may be substantially offset vertically from one another but still include at least some area that is vertically aligned or overlapping.

The left and right FET portions 205, 206 of the bottom FET layer 204 are at least substantially the same height as one another and are arranged so as to be substantially coplanar with one another. More specifically, an uppermost surface of the left FET portion 205 is substantially coplanar with an uppermost surface of the right FET portion 206, and a lowermost surface of the left FET portion 205 is substantially coplanar with a lowermost surface of the right FET portion 206. Accordingly, the uppermost surfaces of the left and right FET portions 205, 206 are considered to define an uppermost surface 230 of the bottom FET layer 204. Similarly, the lowermost surfaces of the left and right FET portions 205, 206 are considered to define a lowermost surface 232 of the bottom FET layer 204.

Likewise, the left and right FET portions 209, 210 of the top FET layer 208 are at least substantially the same height as one another and are arranged so as to be substantially coplanar with one another. More specifically, an uppermost surface of the left FET portion 209 is substantially coplanar with an uppermost surface of the right FET portion 210, and a lowermost surface of the left FET portion 209 is substantially coplanar with a lowermost surface of the right FET portion 210. Accordingly, the uppermost surface of the left and right FET portions 209, 210 are considered to define an uppermost surface 234 of the top FET layer 208, and the lowermost surfaces of the left and right FET portions 209, 210 are considered to define a lowermost surface 236 of the top FET layer 208.

The interconnect 228 has a top surface 240 and a bottom surface 242 that is opposite the top surface 240. The interconnect 228 also has a left surface 244 and a right surface 246 that is opposite the left surface 244. The left surface 244 and the right surface 246 extend from the bottom surface 242 to the top surface 240. The interconnect 228 is arranged such that the left surface 244 of the interconnect 228 is in direct contact with the first CMOS cell 212 and such that the right surface 246 is in direct contact with the second CMOS cell 216.

In the particular embodiment shown in FIG. 2, in the CFET arrangement 200, the left surface 244 of the interconnect 228 is in direct contact with the left FET portion 205 of the bottom FET layer 204, and the right surface 246 of the interconnect 228 is in direct contact with the right FET portion 210 of the top FET layer 208. The left and right FET portions 205, 206, 209, 210 of the bottom and top FET layers 204, 208 are arranged such that the interconnect 228 does not interfere or intersect with any other structures between the left FET portion 205 of the bottom FET layer 204 and the right FET portion 210 of the top FET layer 208.

Furthermore, the interconnect 228 is arranged such that the top surface 240 does not extend substantially above the uppermost surface 234 of the top FET layer 208. More specifically, the phrase "does not extend substantially above" is inclusive of embodiments wherein the interconnect 228 extends a relatively small amount above the uppermost surface 234 of the top FET layer 208 to the extent that the interconnect 228 does not require additional height above what is already required for the CFET arrangement 200 and the interconnect 228 does not contribute to complication or congestion with other interconnects, such as interconnect 224. More specifically, the interconnect 228 may extend above the uppermost surface 234 of the top FET layer 208 to a height that is less than a height at which other interconnects, such as interconnect 224 extend relative to the uppermost surface 234. In all embodiments, the interconnect 228 is arranged such that the interconnect 228 does not require additional height to occupy space above that which is already required for the other interconnects and does not interfere or contribute to complication or congestion with the other interconnects.

Additionally, or alternatively, the interconnect 228 is further arranged such that the bottom surface 242 does not extend substantially below the lowermost surface 232 of the bottom FET layer 204. This arrangement prevents the interconnect 228 from requiring additional height to occupy space extending beneath that which is already required for the bottom FET layer 204 or any other buried or backside interconnect below.

In the particular embodiment shown in FIG. 2, the interconnect 228 is arranged such that the top surface 240 is substantially coplanar with the uppermost surface 234 of the top FET layer 208. In such embodiments, the full sidewall surface of the right FET portion 210 of the top FET layer 208 is being contacted. Additionally, the interconnect 228 is arranged such that the bottom surface 242 is substantially coplanar with the lowermost surface 232 of the bottom FET layer 204. In such embodiments, the full sidewall surface of the left FET portion 205 of the bottom FET layer 204 is being contacted. In alternative embodiments, either one or neither of the top surface 240 and the bottom surface 242 may be substantially coplanar with the uppermost surface 234 and the lowermost surface 232, respectively.

As mentioned above, in a CFET arrangement, the polarity of the bottom FET is opposite to the polarity of the top FET. In the CFET arrangement 200, the bottom FET layer 204 is a layer of PFETs and the top FET layer 208 is a layer of NFETs. However, in alternative embodiments, the polarities of the bottom and top FET layers can be reversed.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (ME). In general, ME uses chemically reactive plasma to remove material deposited on wafers. With RIE the plasma is generated under low pressure (vacuum) by an electromagnetic field. High-energy ions from the ME plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

To build the complex structures that make up a transistor and the many wires that connect the millions of transistors of a circuit, each of these processes may be performed many times. For example, lithography and etch pattern transfer steps may be repeated multiple times. Each pattern being printed on the substrate is aligned to previously formed patterns, and gradually the conductive and insulative regions are built up to form the final device.

Figure 3:
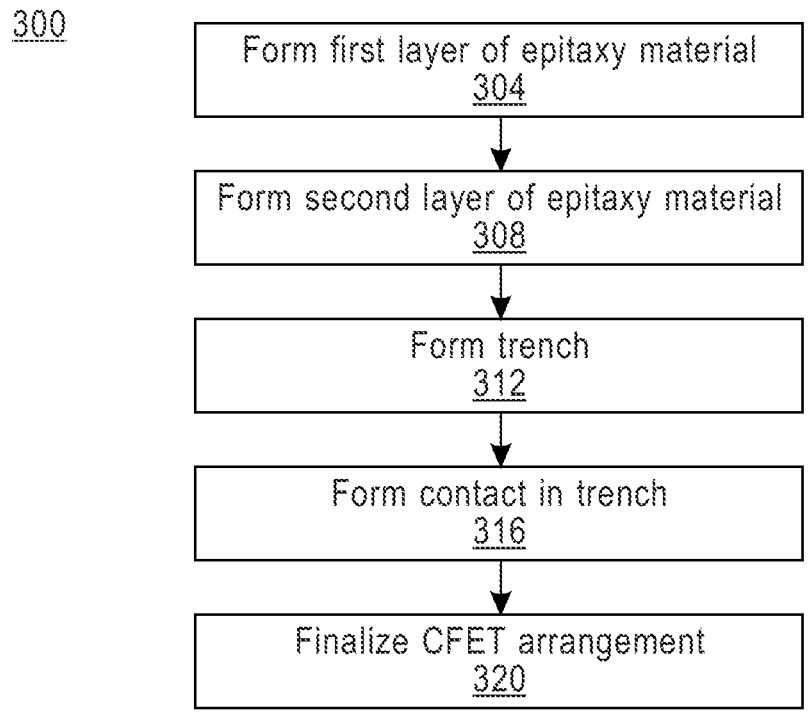
FIG. 3 illustrates a flowchart of an example method for forming a CFET arrangement, in accordance with embodiments of the present disclosure.

FIG. 3 depicts a flowchart of an example method 300 for forming a CFET arrangement, such as CFET arrangement 200 shown in FIG. 2, according to embodiments of the present disclosure. The method 300 begins with operation 304, wherein a first layer of epitaxy material is formed. More specifically, the first layer of epitaxy material is formed so as to include a first area and a second area. The first layer of epitaxy material has a first polarity. In accordance with embodiments of the present disclosure, the performance of operation 304 may include the performance of one or more sub-operations.

In accordance with at least one embodiment of the present disclosure, forming the first layer of epitaxy material includes providing or preparing the underlying integrated circuit structure on which the first layer of epitaxy material is formed. Such a structure is shown in FIGS. 4, 5A, and 5B, which depict various views of an example structure 400.

Figure 4:
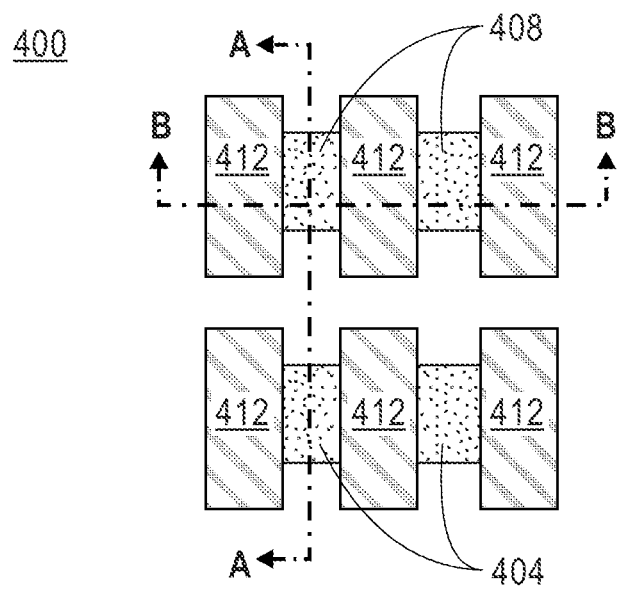
FIG. 4 illustrates a schematic top plan view of an example of an arrangement following the performance of a portion of the example method of FIG. 3, in accordance with embodiments of the present disclosure.

In particular, FIG. 4 depicts a schematic top plan view of the example structure 400, including a line A, which indicates a first cross-sectional cut, and a line B, which indicates a second cross-sectional cut. FIG. 5A depicts a schematic cross-sectional view of the example structure 400 cut along line A in FIG. 4, and FIG. 5B depicts a schematic cross-sectional view of the example structure 400 cut along line B in FIG. 4. Subsequent schematic drawings of the example structure 400 depicting these same views are similarly numbered.

FIG. 4 shows a first active region 404 and a second active region 408. In the example embodiment shown, each active region 404, 408 includes nanosheet stacks, which will form the CFET devices, and dummy gates 412 are formed over the active regions 404, 408.

Figure 5A:
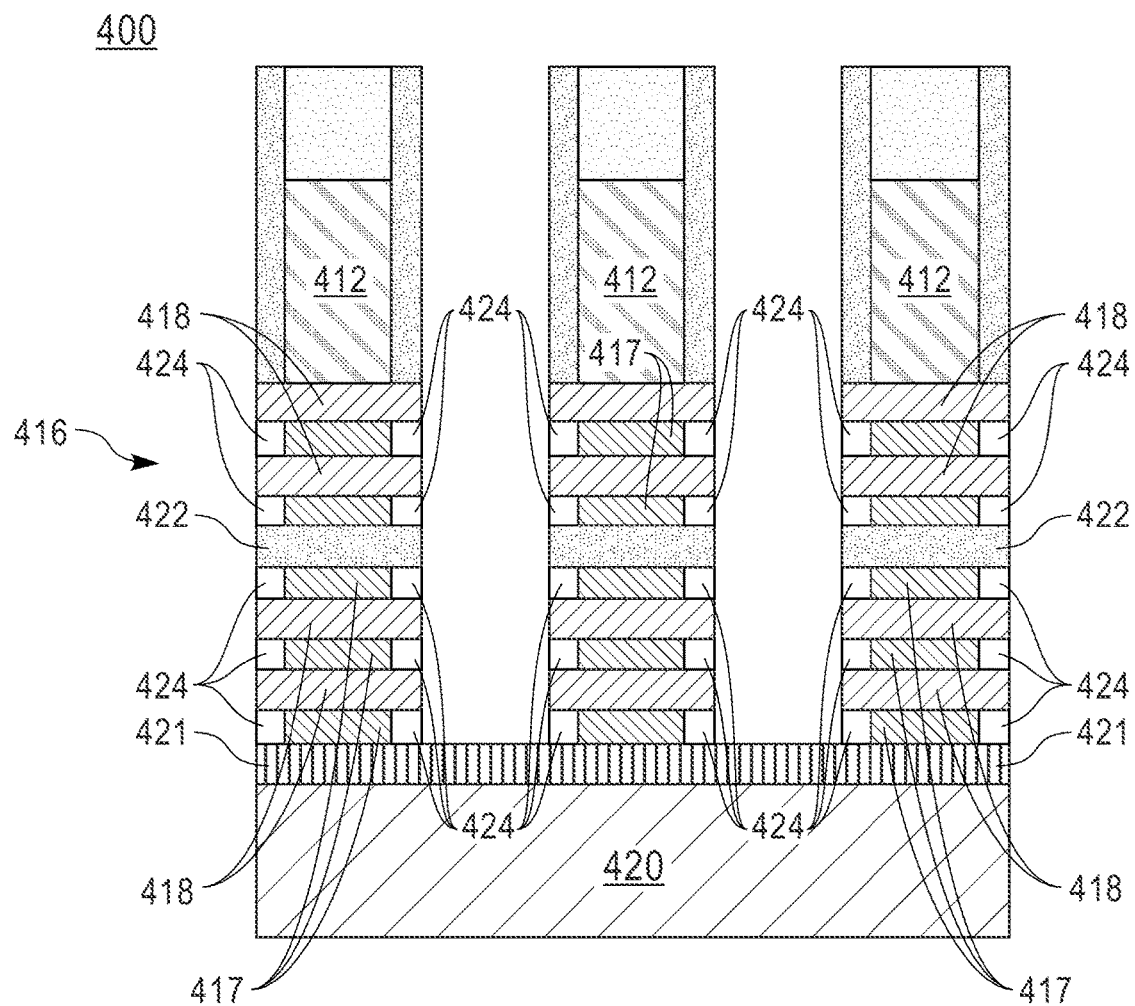
FIG. 5A illustrates a schematic cross-sectional view cut along a first line of the example arrangement shown in FIG. 4 following the performance of the portion of the example method of FIG. 3, in accordance with embodiments of the present disclosure.
Figure 5B:
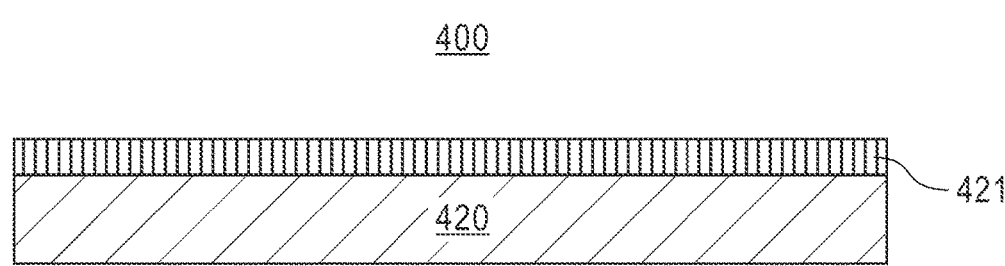
FIG. 5B illustrates a schematic cross-sectional view cut along a second line of the example arrangement shown in FIG. 4 following the performance of the portion of the example method of FIG. 3, in accordance with embodiments of the present disclosure.

As shown in FIG. 5A, as described in further detail below, the nanosheet stacks 416 have been formed and patterned on a bottom isolation layer 421 of a substrate 420, and the dummy gates 412 have been formed and patterned on top of the nanosheet stacks 416. The substrate 420 and bottom isolation layer 421 can be formed, for example, using silicon on insulator (SOI) or SiGe-on-insulator (SGOI) technology. The bottom isolation layer 421 can be, for example, a buried oxide (BOX) layer formed in the substrate 420. In particular, the bottom isolation layer 421 can be a BOX SiO2 layer. The nanosheet stacks 416 can be formed with alternating SiGe and Si layers formed by epitaxy growth.

More specifically, each nanosheet stack 416 includes alternating layers of silicon germanium 417 (to form the gates) and silicon 418 (to form the channels) with as many layer pairs as the finished device will have channels. The layer that is arranged nearest to the bottom isolation layer 421 is a silicon germanium layer. In at least one embodiment, the silicon germanium layers are made of SiGe30%. Additionally, a number of the layers will make up the channels of the upper FETs, and a number of the layers will make up the channels of the lower FETs. Accordingly, the nanosheet stacks 416 are also formed with a separation layer that separates the layers of the upper FETs from the layers of the lower FETs. In at least one embodiment, the separation layer can be made of SiGe55%.

After the nanosheet stacks 416 have been patterned, the dummy gates 412 are formed and patterned on top of the nanosheet stacks 416.

In the example structure 400 shown in FIG. 5A, after the patterning of the dummy gates 412, the separation layer has been removed to form a cavity between the nanosheet stacks that will make up the upper FETs and the nanosheet stacks that will make up the lower FETs. A gate sidewall spacer is conformally deposited so as to isolate the dummy gates 412, and the deposition of the gate sidewall spacer also forms an isolation layer 422 in the cavity formed by the removal of the separation layer to separate the nanosheets that will make up the upper FET channels from the nanosheets that will make up the lower FET channels.

Subsequently, in the example structure 400 shown in FIG. 5A, the nanosheets have been etched between the gate sidewall spacers of the dummy gates 412, exposed SiGe has been indented, and inner spacers 424 have been formed in the resulting spaces adjacent to each of the nanosheets by conformally depositing a dielectric liner followed by isotropic etching back the spacers. Please note that while the embodiment illustrated in these figures uses a SGOI wafer as a starting substrate, the disclosure is not limited to such embodiments. In alternative embodiments, the disclosure could utilize, for example, bulk Si substrate or another type of substrate as the starting substrate.

In accordance with at least one embodiment of the present disclosure, once the underlying integrated circuit structure has been provided or prepared, operation 304 includes sub-operations of forming the first layer of epitaxy material and recessing the first layer of epitaxy material.

Figure 6A:
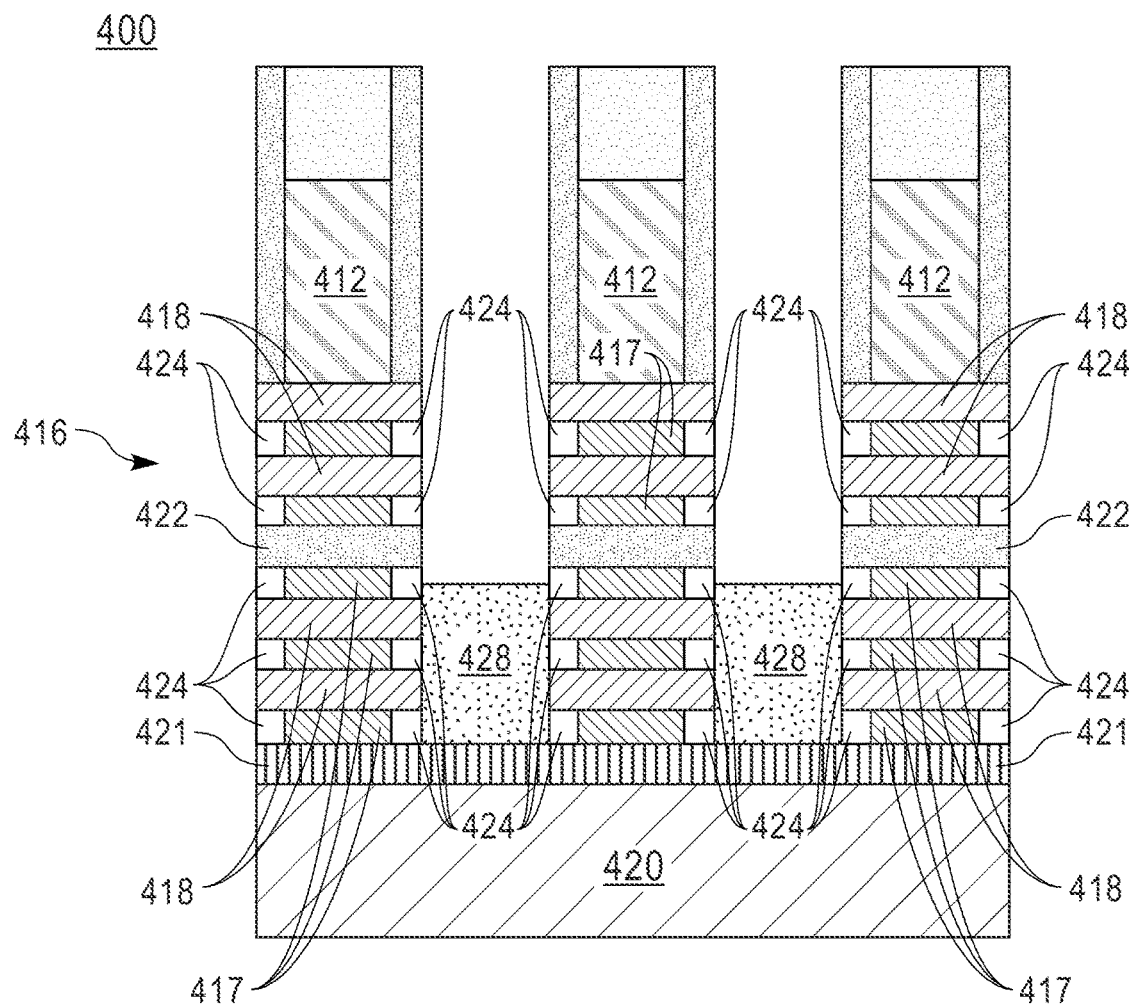
FIG. 6A illustrates a schematic cross-sectional view cut along a first line of the example arrangement shown in FIG. 4 following the performance of the portion of the example method of FIG. 3, in accordance with embodiments of the present disclosure.
Figure 6B:
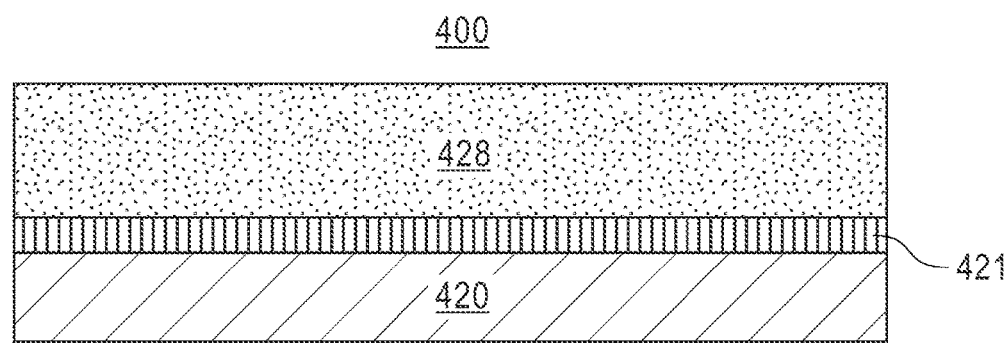
FIG. 6B illustrates a schematic cross-sectional view cut along a second line of the example arrangement shown in FIG. 4 following the performance of the portion of the example method of FIG. 3, in accordance with embodiments of the present disclosure.

FIGS. 6A-6B depict the example structure 400 following the performance of these sub-operations of operation 304. As shown in FIG. 6A, the first layer of epitaxy material 428 is formed between the dummy gates 412 and does not extend above the isolation layer 422. In other words, the first layer of epitaxy material 428 only contacts the nanosheets that will make up the lower FET channels. Accordingly, the first layer of epitaxy material 428 only forms the source/drain for the lower FET channels. The first layer of epitaxy material 428, shown in FIGS. 6A and 6B, has a first polarity. In accordance with at least one embodiment, the first layer of epitaxy material 428 is p-doped. Accordingly, in such embodiments, the lower FETs will be PFETs. In accordance with at least one embodiment of the present disclosure, the first layer of epitaxy material 428 is formed by first growing excessive epitaxy material from all exposed nanosheet sidewall surfaces with extended epitaxy lateral growth as well, followed by recessing the epitaxy material that is formed over the top device.

In accordance with at least one embodiment of the present disclosure, once the first layer of epitaxy material has been formed and recessed, operation 304 further includes a sub-operation of patterning the first layer of epitaxy material. In particular, the first layer of epitaxy material is patterned based on the circuit design. The first layer of epitaxy material is patterned such that a first region of the epitaxy material is aligned with a first set of nanosheets that will form the channels of a first lower FET and such that a second region of the epitaxy material is aligned with a second set of nanosheets that will form the channels of a second lower FET. The first region corresponds to the first area of the first layer of epitaxy material and the second region corresponds to the second area of the first layer of epitaxy material that are formed in the performance of operation 304.

Figure 7A:
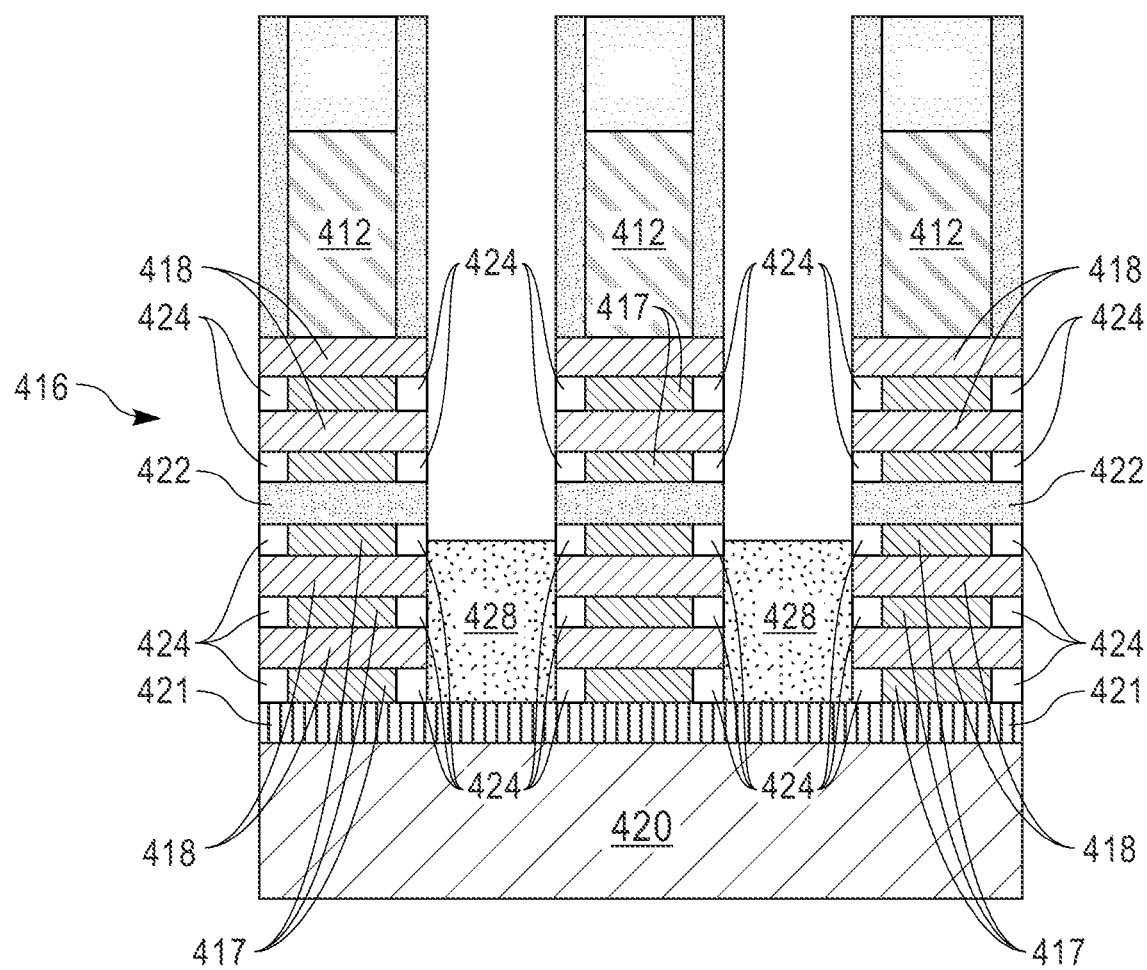
FIG. 7A illustrates a schematic cross-sectional view cut along a first line of the example arrangement shown in FIG. 4 following the performance of the portion of the example method of FIG. 3, in accordance with embodiments of the present disclosure.
Figure 7B:
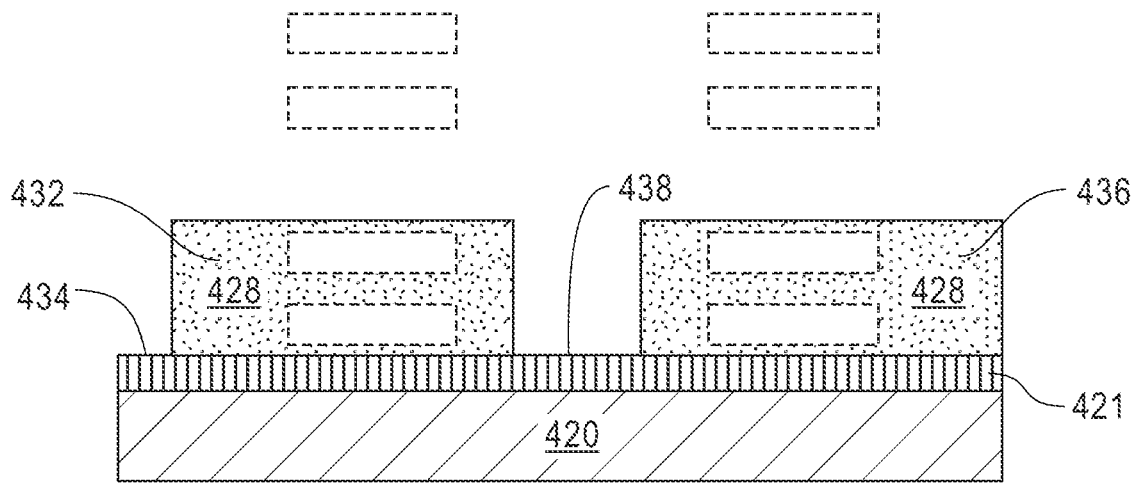
FIG. 7B illustrates a schematic cross-sectional view cut along a second line of the example arrangement shown in FIG. 4 following the performance of the portion of the example method of FIG. 3, in accordance with embodiments of the present disclosure.
Figure 7C:
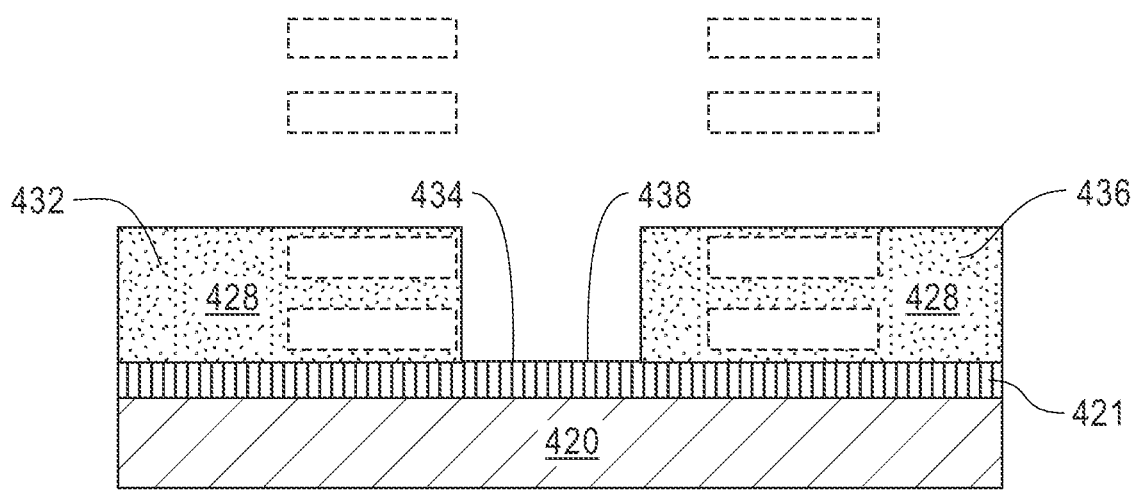
FIG. 7C illustrates a schematic cross-sectional view cut along a second line of the example arrangement shown in FIG. 4 following the performance of the portion of the example method of FIG. 3, in accordance with embodiments of the present disclosure.
Figure 7D:
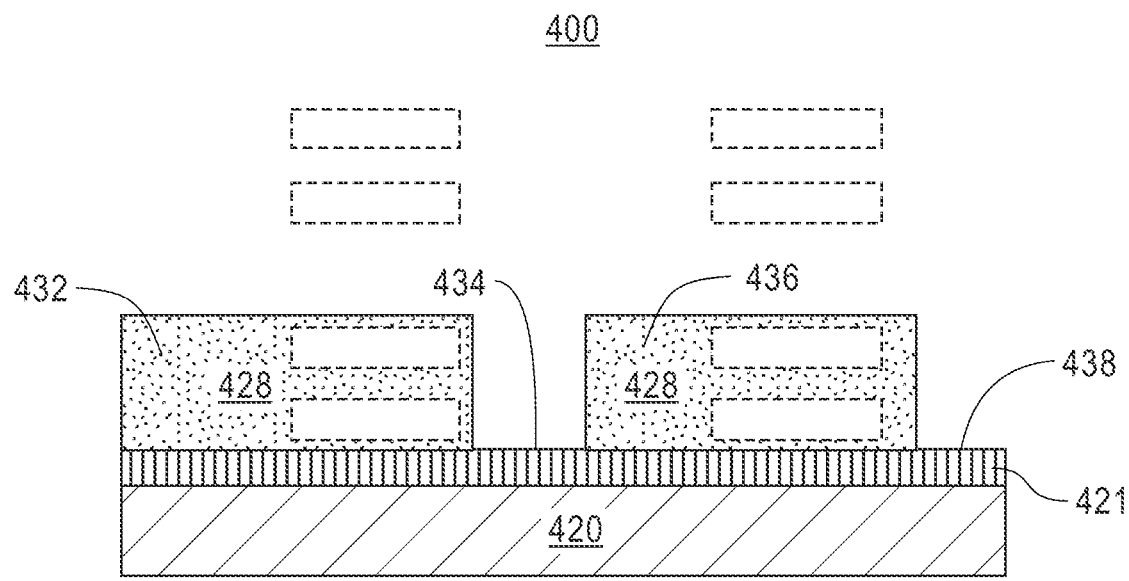
FIG. 7D illustrates a schematic cross-sectional view cut along a second line of the example arrangement shown in FIG. 4 following the performance of the portion of the example method of FIG. 3, in accordance with embodiments of the present disclosure.
Figure 7E:
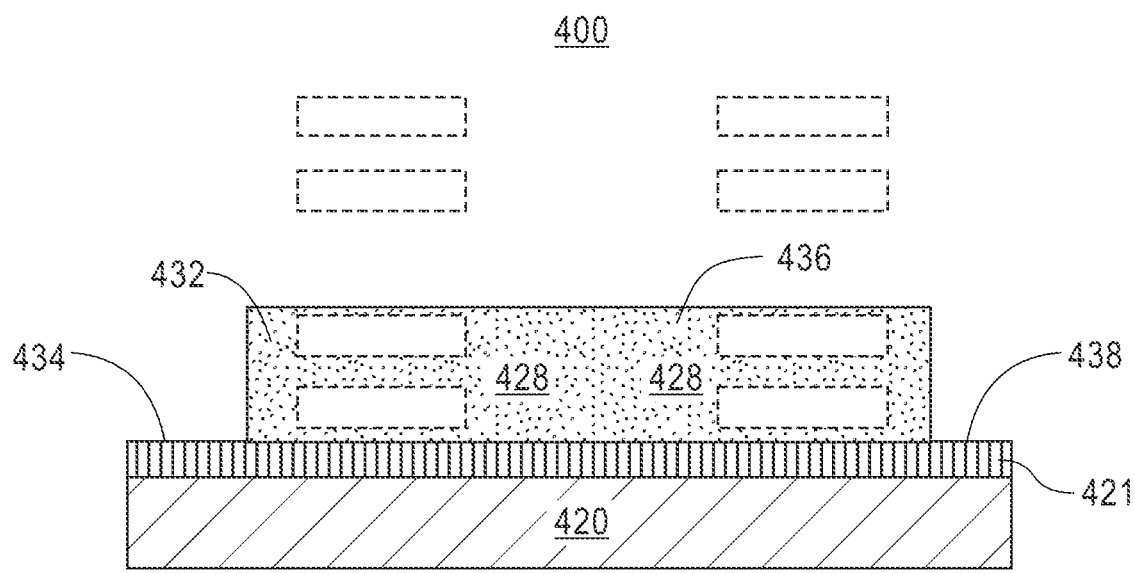
FIG. 7E illustrates a schematic cross-sectional view cut along a second line of the example arrangement shown in FIG. 4 following the performance of the portion of the example method of FIG. 3, in accordance with embodiments of the present disclosure.
Figure 8A:
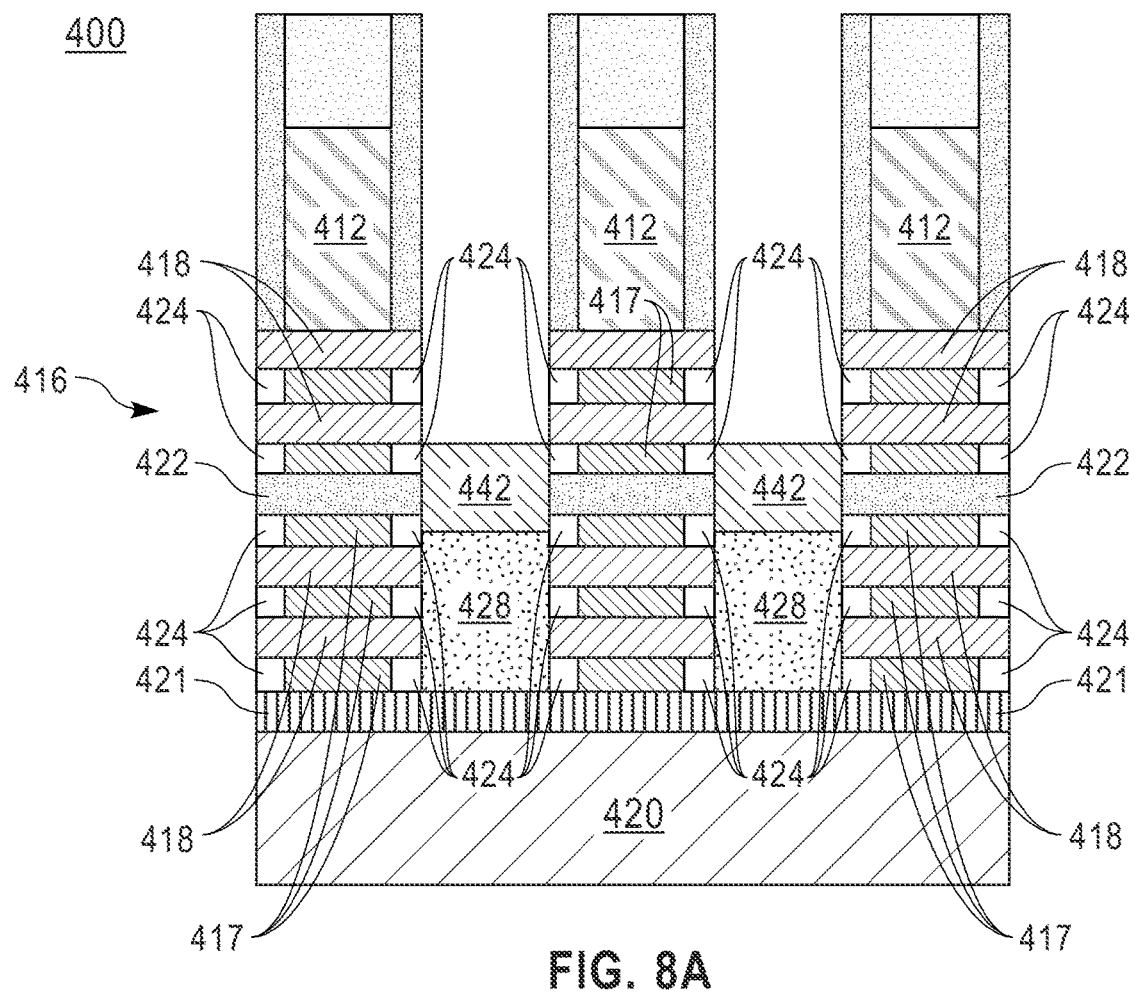
FIG. 8A illustrates a schematic cross-sectional view cut along a first line of the example arrangement shown in FIG. 4 following the performance of the portion of the example method of FIG. 3, in accordance with embodiments of the present disclosure.
Figure 8B:
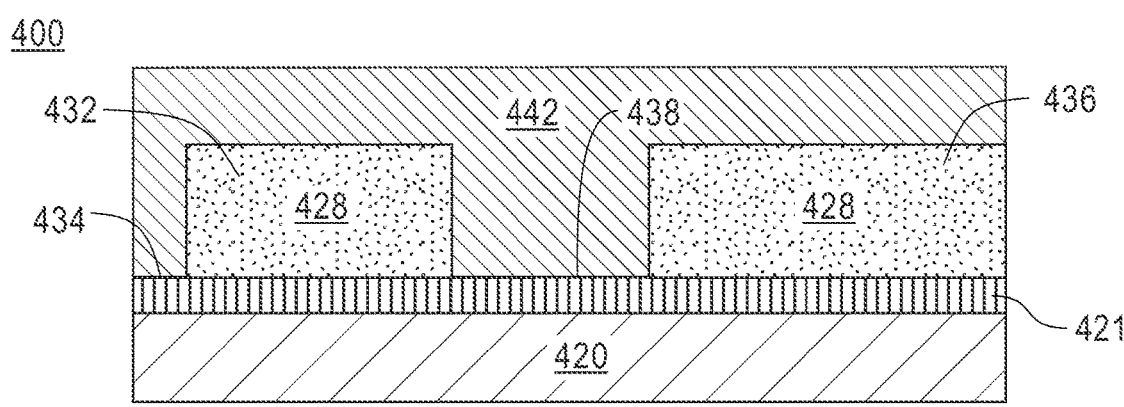
FIG. 8B illustrates a schematic cross-sectional view cut along a second line of the example arrangement shown in FIG. 4 following the performance of the portion of the example method of FIG. 3, in accordance with embodiments of the present disclosure.
Figure 8C:
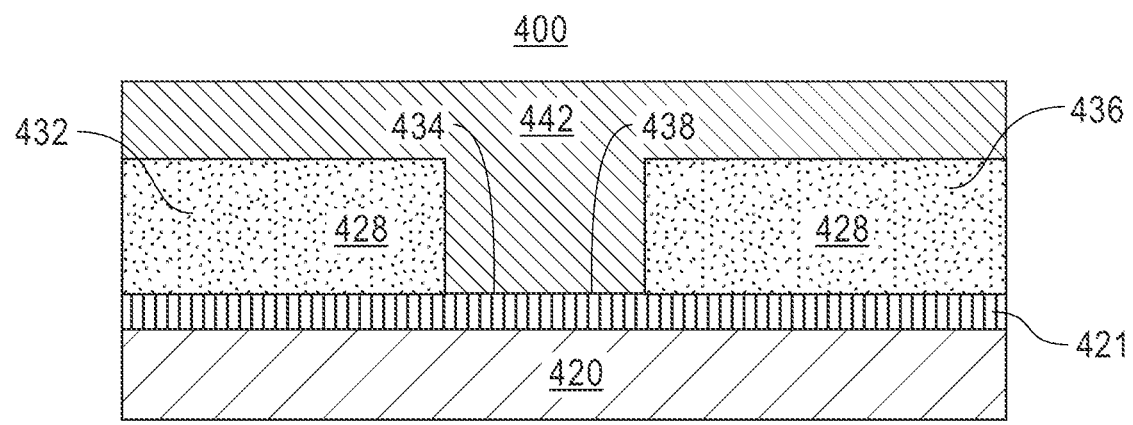
FIG. 8C illustrates a schematic cross-sectional view cut along a second line of the example arrangement shown in FIG. 4 following the performance of the portion of the example method of FIG. 3, in accordance with embodiments of the present disclosure.
Figure 8D:
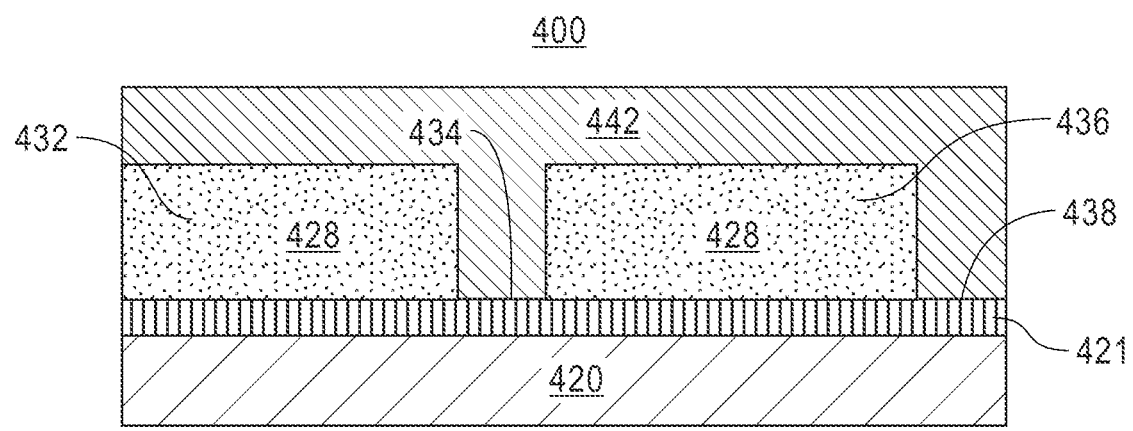
FIG. 8D illustrates a schematic cross-sectional view cut along a second line of the example arrangement shown in FIG. 4 following the performance of the portion of the example method of FIG. 3, in accordance with embodiments of the present disclosure.
Figure 8E:
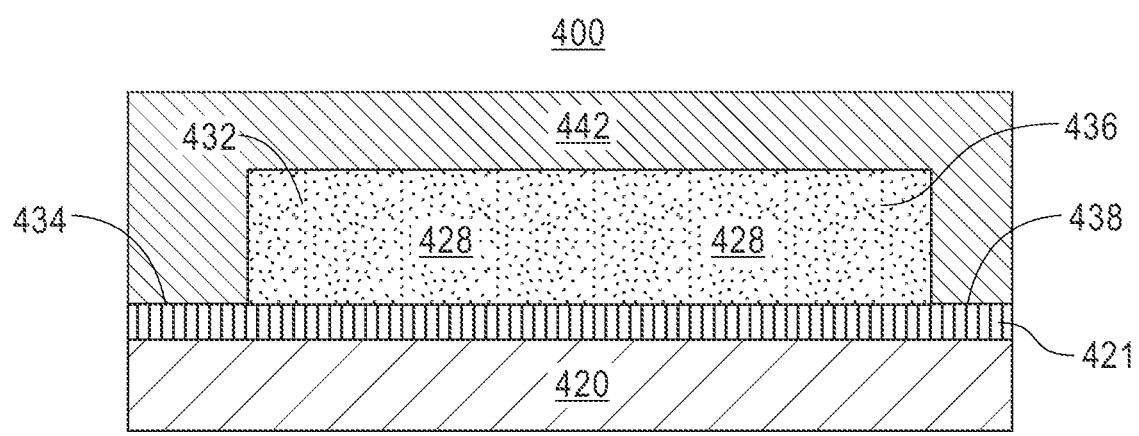
FIG. 8E illustrates a schematic cross-sectional view cut along a second line of the example arrangement shown in FIG. 4 following the performance of the portion of the example method of FIG. 3, in accordance with embodiments of the present disclosure.

FIGS. 7A-7E depict the example structure 400 following the performance of this sub-operation of operation 304. FIGS. 7A and 7B depict the same views of the example structure 400 as FIGS. 5A and 5B. FIGS. 7C-7E depict alternative embodiments of the example structure and show the same view of the example structure 400 as FIG. 7B. Subsequent schematic drawings of the example structure 400 depicting these same views are similarly numbered.

As noted above, in all embodiments, the patterning of the first layer of epitaxy material 428 depends on the particular circuit design. As also noted above, in all embodiments, the first layer of epitaxy material 428 is patterned such that a first region 432 of the epitaxy material is aligned with a first set of nanosheets that will form the channels of a first lower FET and such that a second region 436 of the epitaxy material is aligned with a second set of nanosheets that will form the channels of a second lower FET. For illustration, the FET channels that will be formed by the nanosheets are shown with dashed lines in FIGS. 7B-7E.

As shown in FIG. 7B, in accordance with one embodiment of the present disclosure, the first layer of epitaxy material 428 is patterned so as to form, from left to right, a first space 434, the first region 432 of epitaxy material, a second space 438, and the second region 436 of epitaxy material. As shown in FIG. 7C, in accordance with another embodiment of the present disclosure, the first layer of epitaxy material 428 is patterned so as to form, from left to right, the first region 432 of epitaxy material, the first space 434, the second space 438, and the second region 436 of epitaxy material. As shown in FIG. 7D, in accordance with another embodiment of the present disclosure, the first layer of epitaxy material 428 is patterned so as to form, from left to right, the first region 432 of epitaxy material, the first space 434, the second region 436 of epitaxy material, and the second space 438. As shown in FIG. 7E, in accordance with another embodiment of the present disclosure, the first layer of epitaxy material 428 is patterned so as to form, from left to right, the first space 434, the first region 432 of epitaxy material, the second region 436 of epitaxy material, and the second space 438.

Returning to FIG. 3, at operation 308 of the method 300, a second layer of epitaxy material is formed. More specifically, the second layer of epitaxy material is formed so as to include a third area and a fourth area. The third area is arranged at least partially above the first area, and the fourth area is arranged at least partially above the second area. The second layer of epitaxy material has a second polarity that is different than the first polarity. In accordance with embodiments of the present disclosure, the performance of operation 308 may include the performance of one or more sub-operations.

In accordance with at least one embodiment of the present disclosure, the performance of operation 308 includes filling and recessing the structure with a dielectric material prior to forming the second layer of epitaxy material. In such embodiments, for example, the structure following the performance of operation 304 can be overfilled with an interlayer dielectric (ILD) material. Additionally, in such embodiments, CMP can be performed on the structure. Additionally, in such embodiments, the ILD material can be recessed.

FIGS. 8A-8E depict the example structure 400 following the performance of these sub-operations of operation 308. (FIGS. 8A-8E depict the same views of the example structure 400 as FIGS. 7A-7E.) Accordingly, as shown in FIGS. 8A-8E, the ILD material 442 isolates the first layer of epitaxy material 428.

In accordance with at least one embodiment of the present disclosure, the performance of operation 308 further includes sub-operations of forming the second layer of epitaxy material and recessing the second layer of epitaxy material.

Figure 9A:
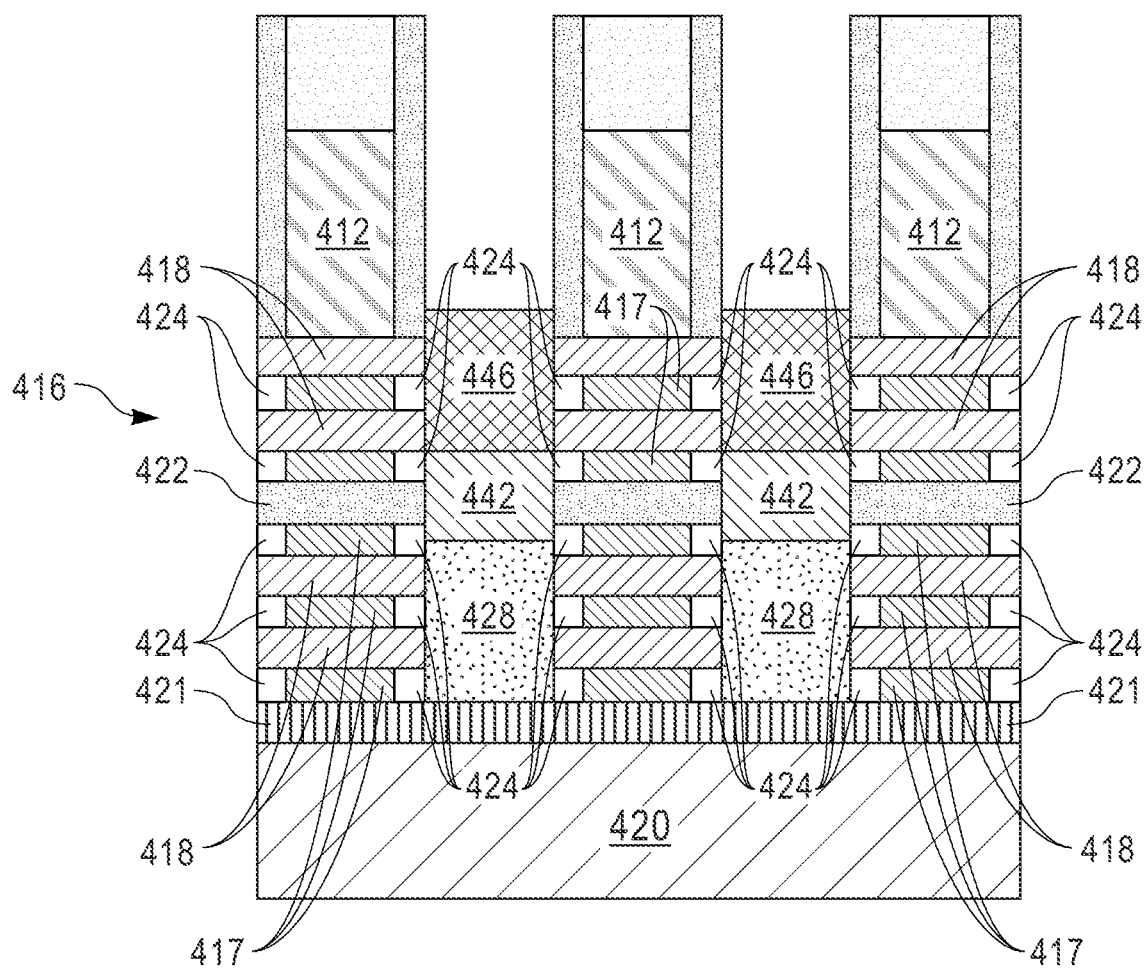
FIG. 9A illustrates a schematic cross-sectional view cut along a first line of the example arrangement shown in FIG. 4 following the performance of the portion of the example method of FIG. 3, in accordance with embodiments of the present disclosure.
Figure 9B:
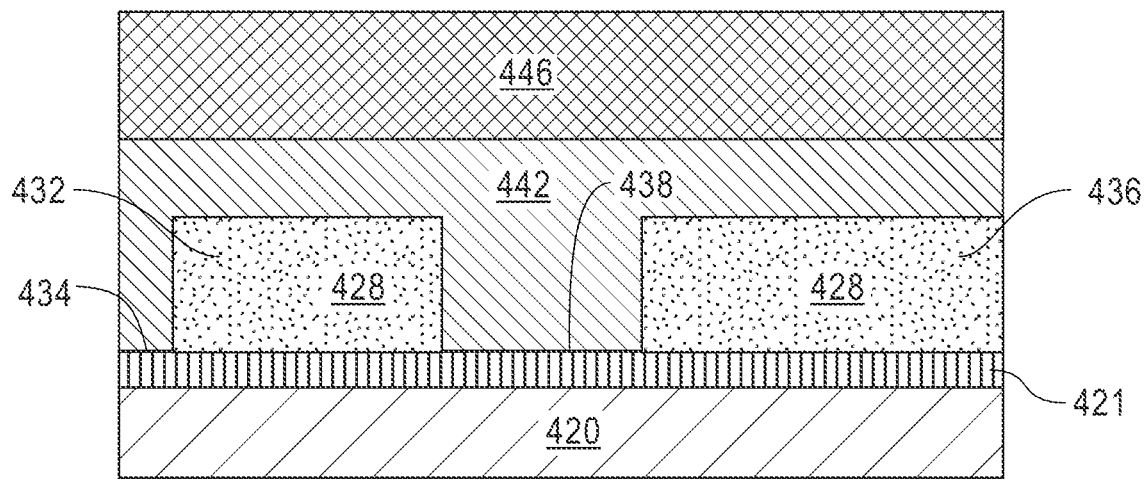
FIG. 9B illustrates a schematic cross-sectional view cut along a second line of the example arrangement shown in FIG. 4 following the performance of the portion of the example method of FIG. 3, in accordance with embodiments of the present disclosure.
Figure 9C:
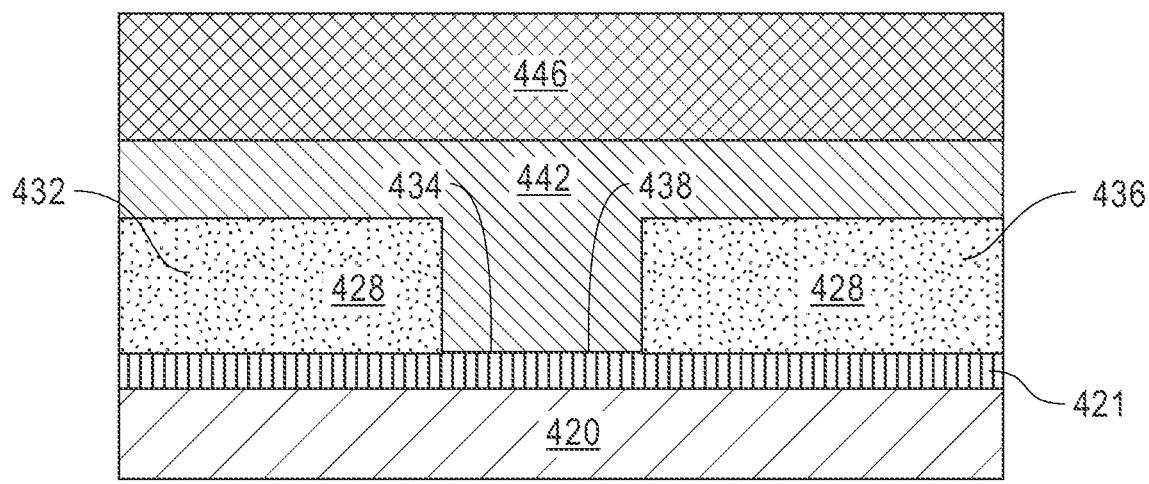
FIG. 9C illustrates a schematic cross-sectional view cut along a second line of the example arrangement shown in FIG. 4 following the performance of the portion of the example method of FIG. 3, in accordance with embodiments of the present disclosure.
Figure 9D:
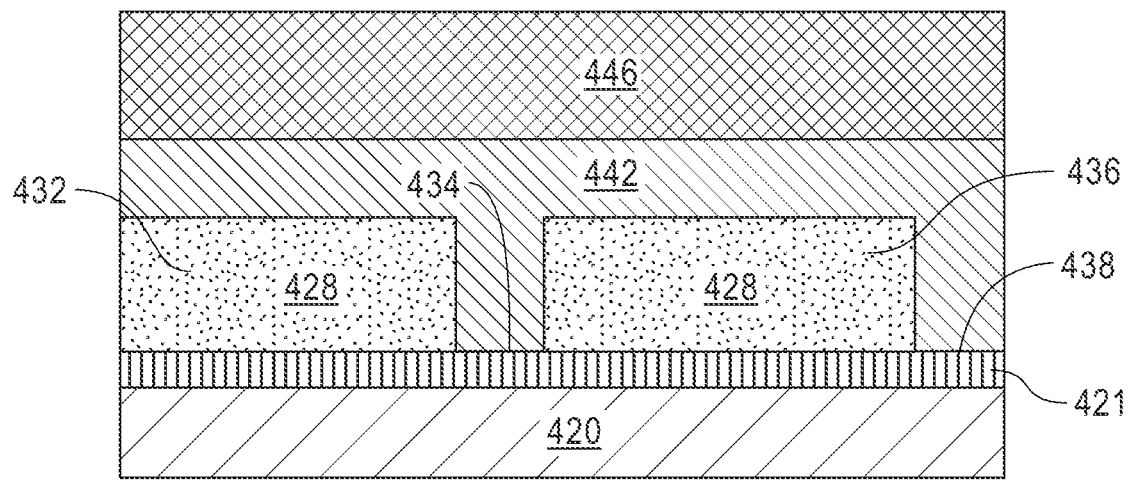
FIG. 9D illustrates a schematic cross-sectional view cut along a second line of the example arrangement shown in FIG. 4 following the performance of the portion of the example method of FIG. 3, in accordance with embodiments of the present disclosure.
Figure 9E:
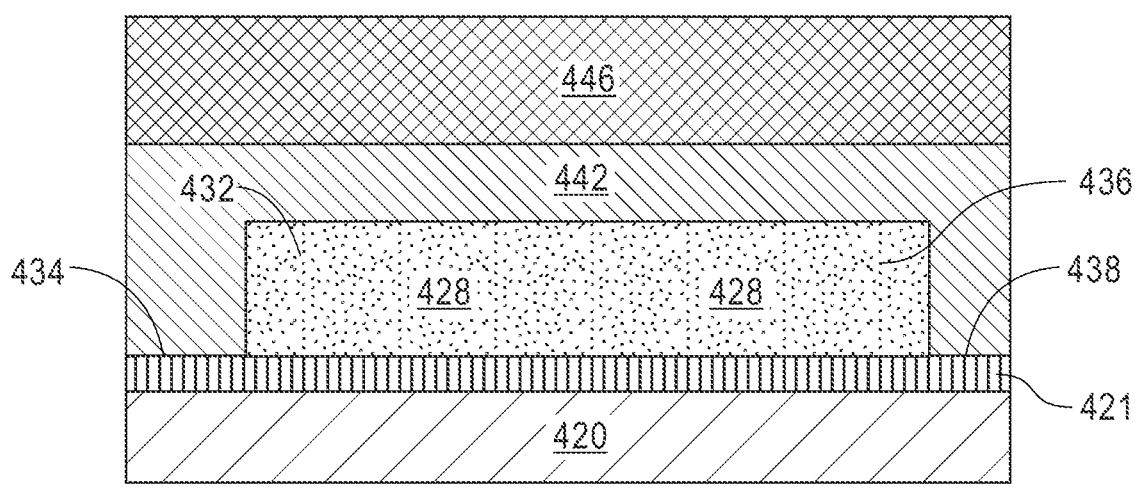
FIG. 9E illustrates a schematic cross-sectional view cut along a second line of the example arrangement shown in FIG. 4 following the performance of the portion of the example method of FIG. 3, in accordance with embodiments of the present disclosure.

FIGS. 9A-9E depict the example structure 400 following the performance of these sub-operations of operation 308. (FIGS. 9A-9E depict the same views of the example structure 400 as FIGS. 7A-7E.) As shown in FIG. 9A, the second layer of epitaxy material 446 is formed between the dummy gates 412 and does not extend below the isolation layer 422. In other words, the second layer of epitaxy material 446 only contacts the nanosheets that will make up the upper FET channels. Accordingly, the second layer of epitaxy material 446 only forms the source/drain for the upper FET channels. The second layer of epitaxy material 446, shown in FIGS. 9A-9E, has a second polarity that is different than the first polarity of the first layer of epitaxy material 428. In accordance with at least one embodiment, the second layer of epitaxy material 446 is n-doped. Accordingly, in such embodiments, the upper FETs will be NFETs. In accordance with at least one embodiment of the present disclosure, the second layer of epitaxy material 446 is formed by firstly growing excessive epitaxy material from all exposed nanosheet sidewall surfaces with extended epitaxy lateral growth as well, followed by recessing the epitaxy material to reduce its height. The height is reduced to the extent that the top surface of the second layer of epitaxy material 446 remains above the top layer of silicon 418 (which will form the channels) of the nanosheet stacks 416.

In accordance with at least one embodiment of the present disclosure, once the second layer of epitaxy material has been formed and recessed, operation 308 further includes a sub-operation of patterning the second layer of epitaxy material. In particular, the second layer of epitaxy material is patterned based on the circuit design. The second layer of epitaxy material is patterned such that a third region of the epitaxy material is aligned with a third set of nanosheets that will form the channels of a first upper FET and such that a fourth region of the epitaxy material is aligned with a fourth set of nanosheets that will form the channels of a second upper FET. The third region corresponds to the third area of the second layer of epitaxy material and the fourth region corresponds to the fourth area of the second layer of epitaxy material that are formed in the performance of operation 308.

FIGS. 10A-10E depict the example structure 400 following the performance of this sub-operation of operation 308. (FIGS. 10A-10E depict the same views of the example structure 400 as FIGS. 7A-7E.) In the same manner as discussed above with respect to the patterning of the first layer of epitaxy material 428, in all embodiments, the patterning of the second layer of epitaxy material 446 depends on the particular circuit design. As also noted above, in all embodiments, the second layer of epitaxy material 446 is patterned such that a third region 450 of the epitaxy material is aligned with a third set of nanosheets that will form the channels of a first upper FET and such that a fourth region 454 of the epitaxy material is aligned with a fourth set of nanosheets that will form the channels of a second upper FET.

Figure 10A:
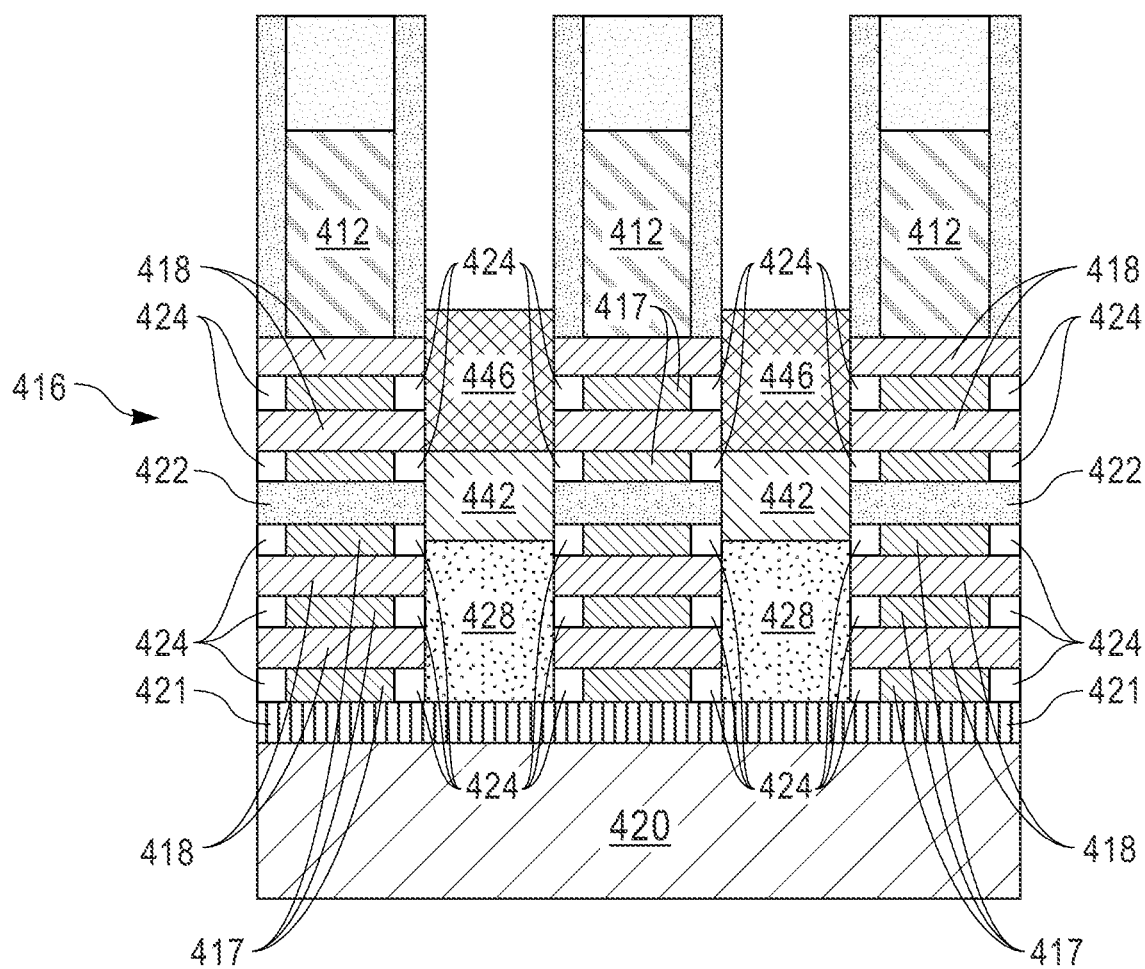
FIG. 10A illustrates a schematic cross-sectional view cut along a first line of the example arrangement shown in FIG. 4 following the performance of the portion of the example method of FIG. 3, in accordance with embodiments of the present disclosure.
Figure 10B:
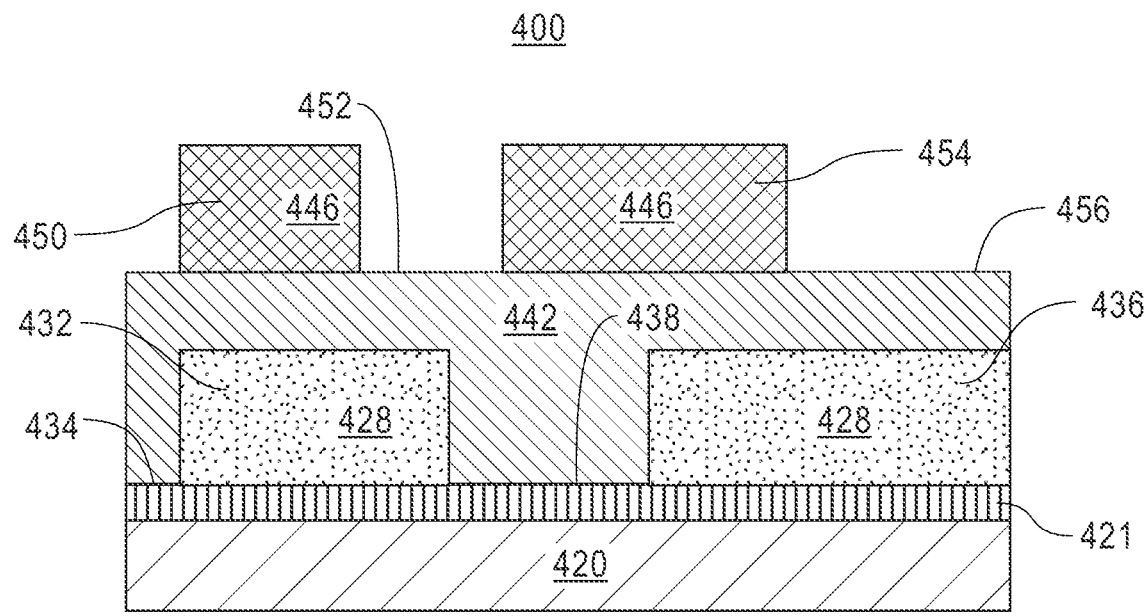
FIG. 10B illustrates a schematic cross-sectional view cut along a second line of the example arrangement shown in FIG. 4 following the performance of the portion of the example method of FIG. 3, in accordance with embodiments of the present disclosure.
Figure 10C:
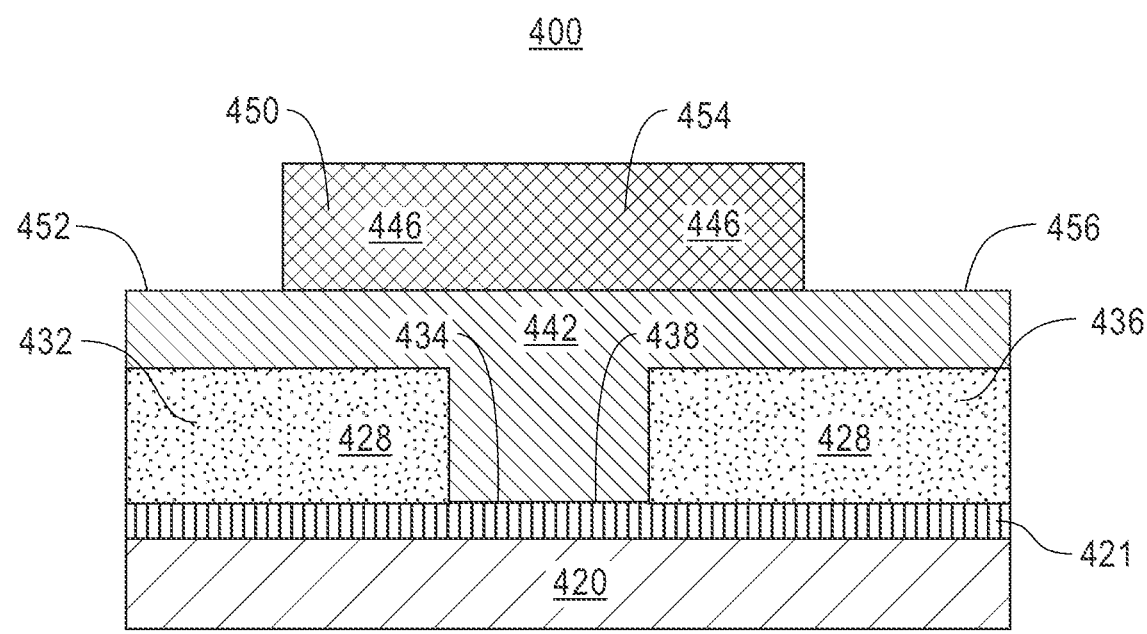
FIG. 10C illustrates a schematic cross-sectional view cut along a second line of the example arrangement shown in FIG. 4 following the performance of the portion of the example method of FIG. 3, in accordance with embodiments of the present disclosure.
Figure 10D:
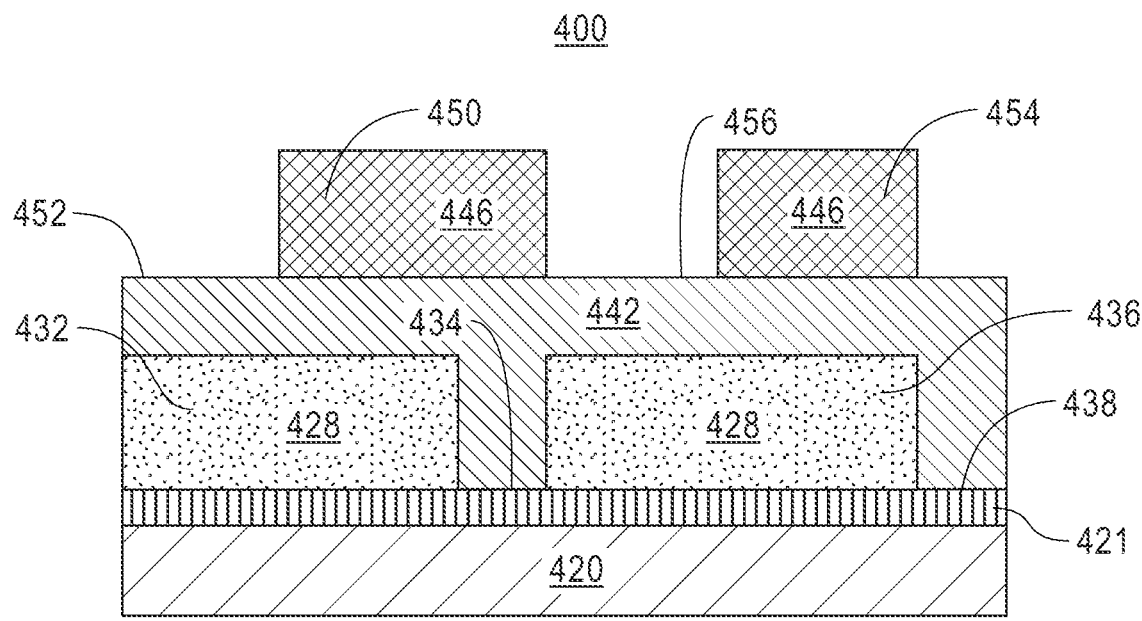
FIG. 10D illustrates a schematic cross-sectional view cut along a second line of the example arrangement shown in FIG. 4 following the performance of the portion of the example method of FIG. 3, in accordance with embodiments of the present disclosure.
Figure 10E:
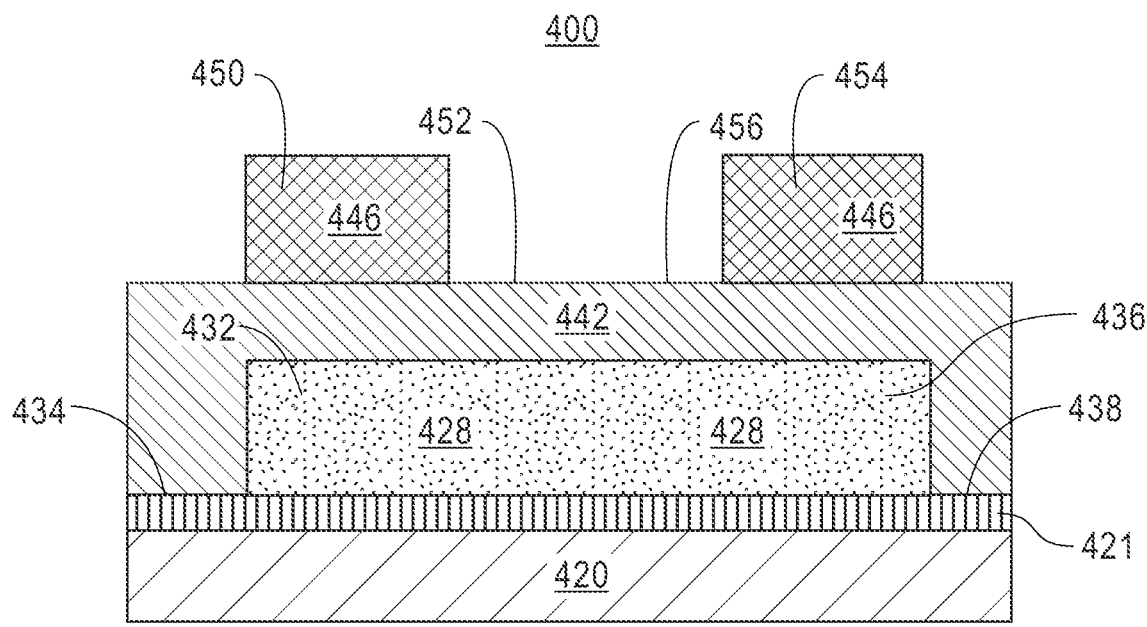
FIG. 10E illustrates a schematic cross-sectional view cut along a second line of the example arrangement shown in FIG. 4 following the performance of the portion of the example method of FIG. 3, in accordance with embodiments of the present disclosure.
Figure 11A:
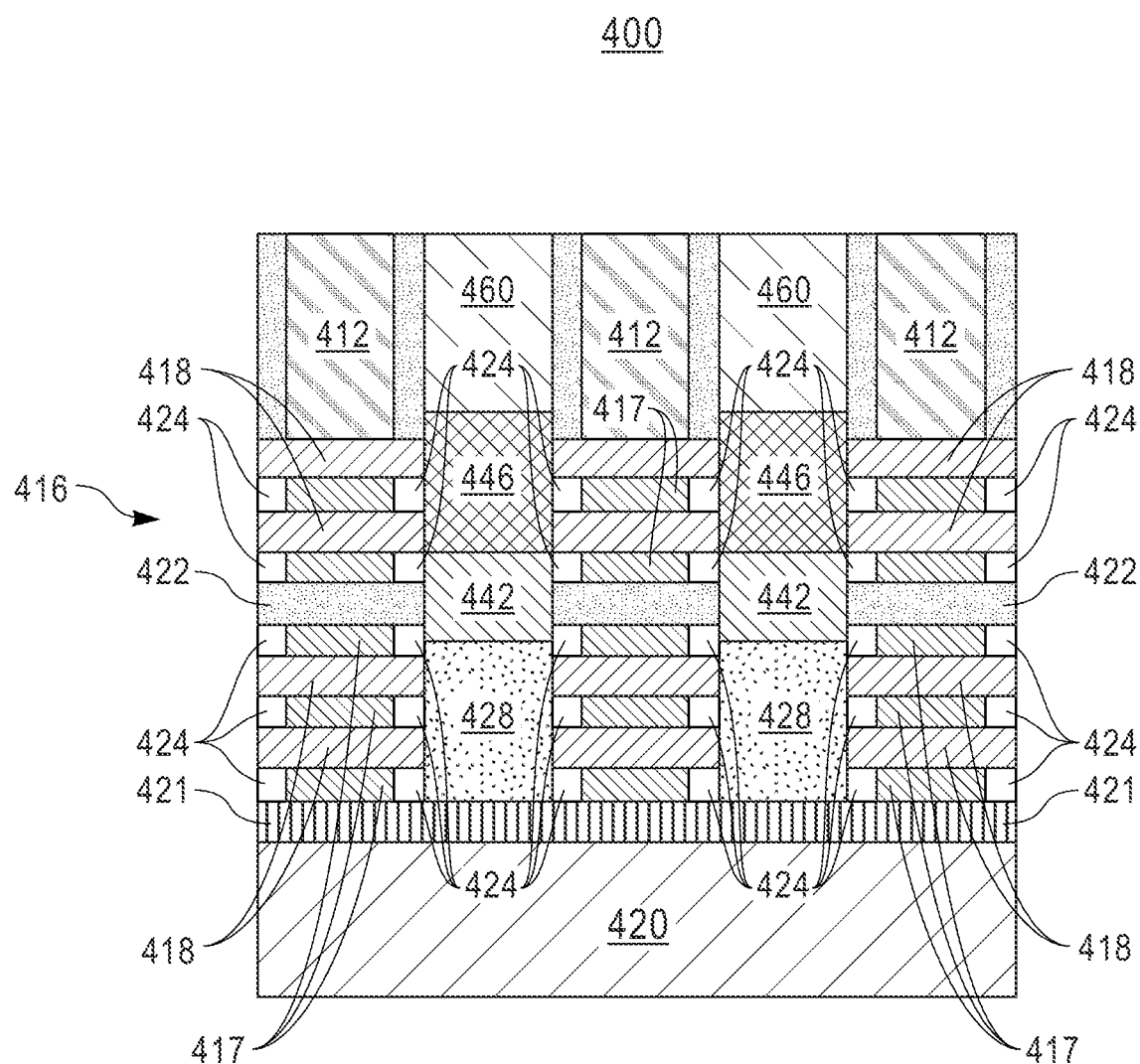
FIG. 11A illustrates a schematic cross-sectional view cut along a first line of the example arrangement shown in FIG. 4 following the performance of the portion of the example method of FIG. 3, in accordance with embodiments of the present disclosure.
Figure 11B:
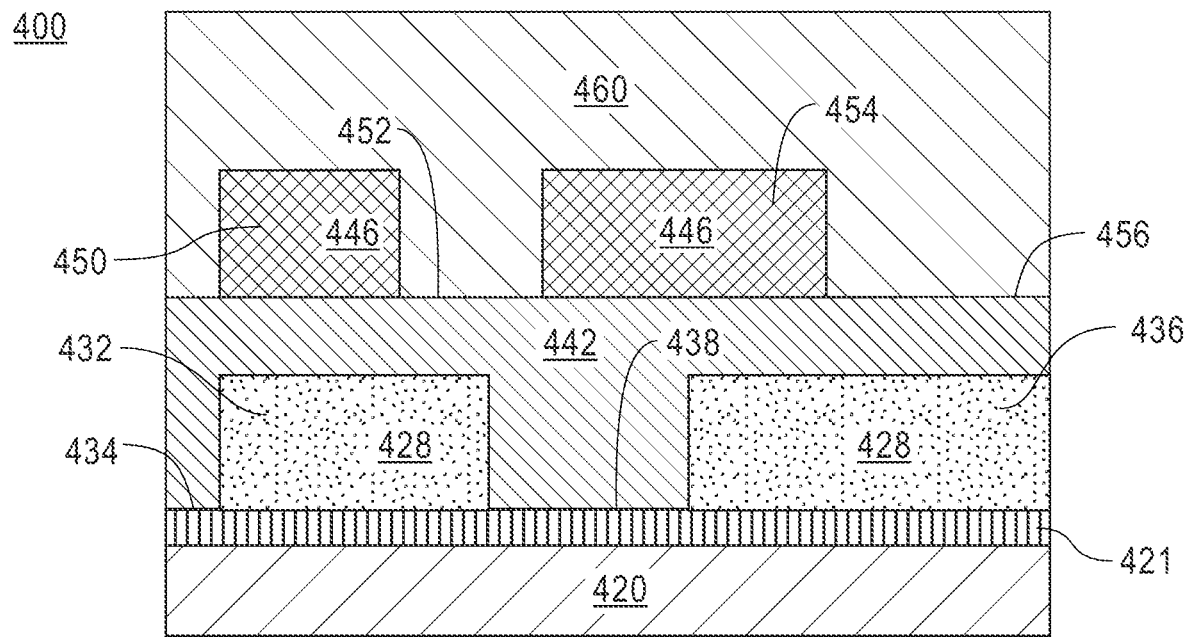
FIG. 11B illustrates a schematic cross-sectional view cut along a second line of the example arrangement shown in FIG. 4 following the performance of the portion of the example method of FIG. 3, in accordance with embodiments of the present disclosure.
Figure 11C:
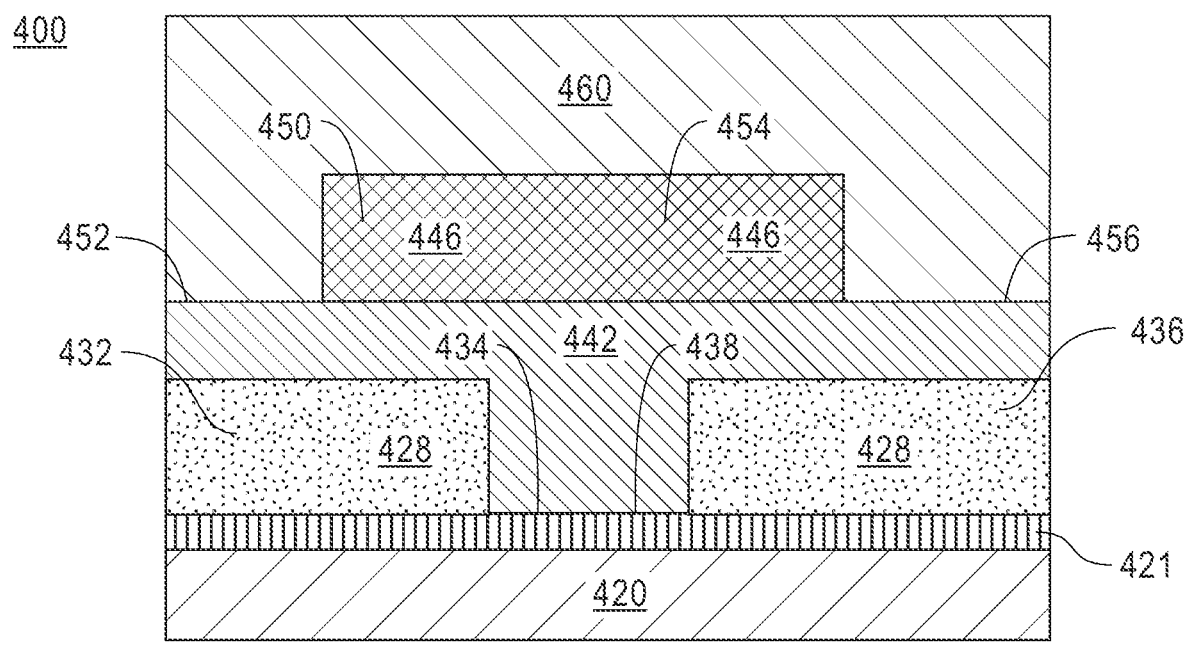
FIG. 11C illustrates a schematic cross-sectional view cut along a second line of the example arrangement shown in FIG. 4 following the performance of the portion of the example method of FIG. 3, in accordance with embodiments of the present disclosure.
Figure 11D:
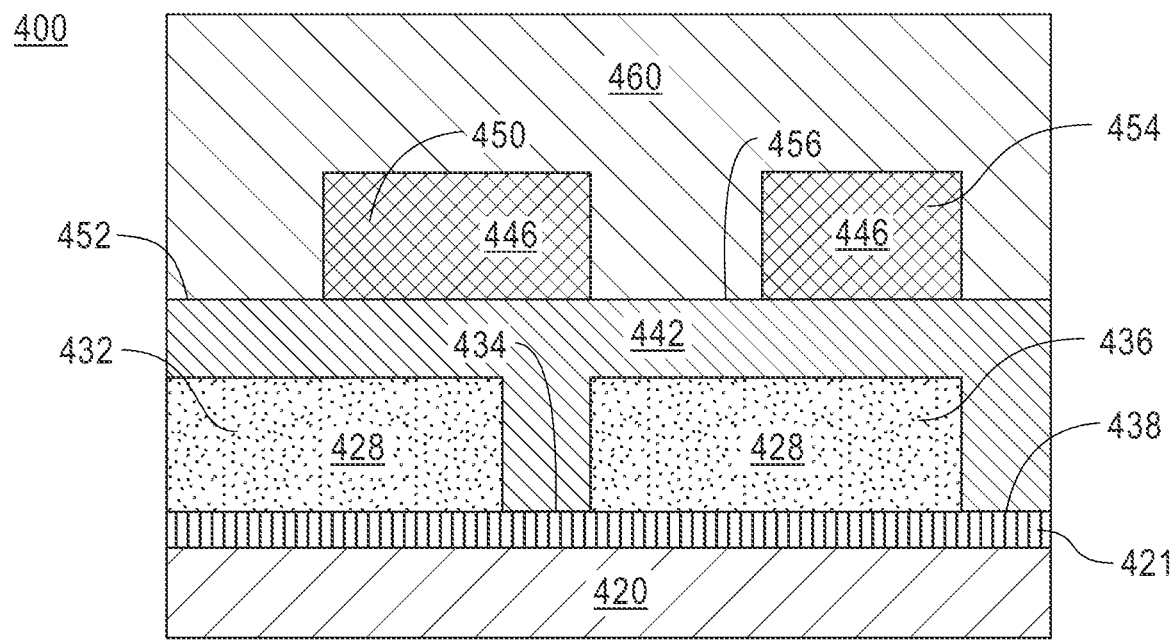
FIG. 11D illustrates a schematic cross-sectional view cut along a second line of the example arrangement shown in FIG. 4 following the performance of the portion of the example method of FIG. 3, in accordance with embodiments of the present disclosure.
Figure 11E:
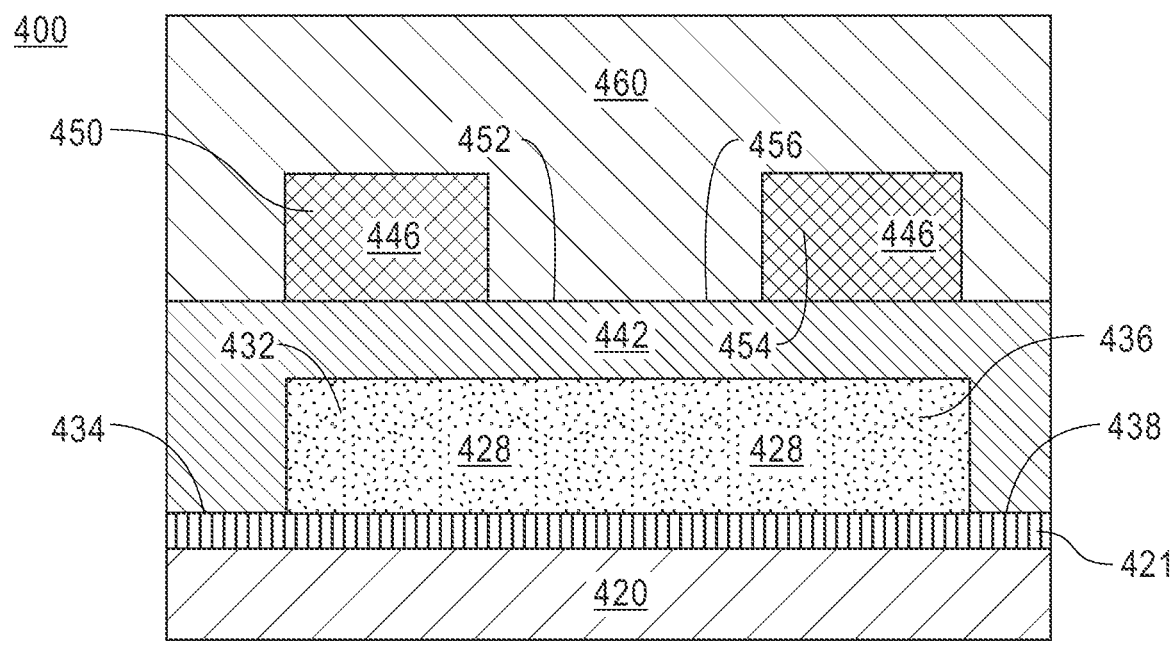
FIG. 11E illustrates a schematic cross-sectional view cut along a second line of the example arrangement shown in FIG. 4 following the performance of the portion of the example method of FIG. 3, in accordance with embodiments of the present disclosure.

As shown in FIG. 10B, in accordance with one embodiment of the present disclosure, the second layer of epitaxy material 446 is patterned so as to form, from left to right, the third region 450 of epitaxy material, a third space 452, the fourth region 454 of epitaxy material, and a fourth space 456. As shown in FIG. 10C, in accordance with another embodiment of the present disclosure, the second layer of epitaxy material 446 is patterned so as to form, from left to right, the third space 452, the third region 450 of epitaxy material, the fourth region 454 of epitaxy material, and the fourth space 456. As shown in FIG. 10D, in accordance with another embodiment of the present disclosure, the second layer of epitaxy material 446 is patterned so as to form, from left to right, the third space 452, the third region 450 of epitaxy material, the fourth space 456, and the fourth region 454 of epitaxy material. As shown in FIG. 10E, in accordance with another embodiment of the present disclosure, the second layer of epitaxy material 446 is patterned so as to form, from left to right, the third region 450 of epitaxy material, the third space 452, the fourth space 456, and the fourth region 454 of epitaxy material.

Returning to FIG. 3, at operation 312 of the method 300, a trench is formed. More specifically, the trench is formed between the first area and the second area and between the third area and the fourth area. In accordance with at least one embodiment of the present disclosure, the performance of operation 312 includes the performance of one or more sub-operations.

In accordance with at least one embodiment of the present disclosure, the performance of operation 312 includes filling and planarizing the structure prior to forming the trench. In such embodiments, for example, the structure following the performance of operation 312 can be overfilled with an ILD material. The ILD material can be, for example, a SiO2 ILD material. Additionally, in such embodiments CMP can be performed on the structure to achieve a planar top surface of the structure.

FIGS. 11A-11E depict the example structure 400 following the performance of these sub-operations of operation 312. (FIGS. 11A-11E depict the same views of the example structure 400 as FIGS. 7A-7E.) Accordingly, as shown in FIGS. 11A-11E, the ILD material 460 isolates the second layer of epitaxy material 446.

In accordance with at least one embodiment of the present disclosure, the performance of operation 312 further includes removing the dummy gates, removing the silicon germanium layers of the nanosheet stacks, forming high-k metal gates (HKMG) in the spaces formed by the removal of the dummy gates and the silicon germanium layers of the nanosheet stacks, and forming sacrificial caps on top of each place where a dummy gate was replaced by a HKMG.

Figure 12A:
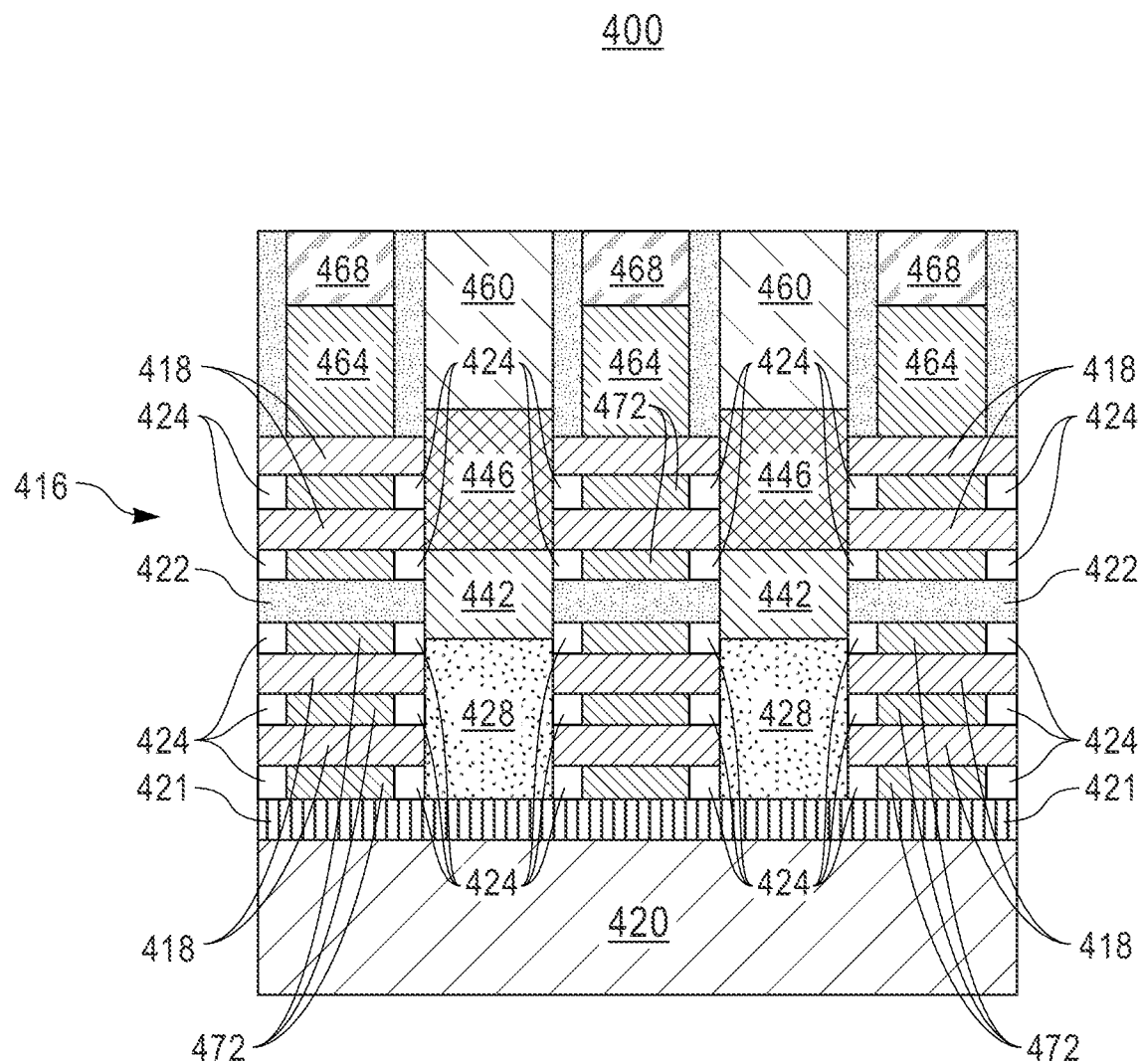
FIG. 12A illustrates a schematic cross-sectional view cut along a first line of the example arrangement shown in FIG. 4 following the performance of the portion of the example method of FIG. 3, in accordance with embodiments of the present disclosure.
Figure 12B:
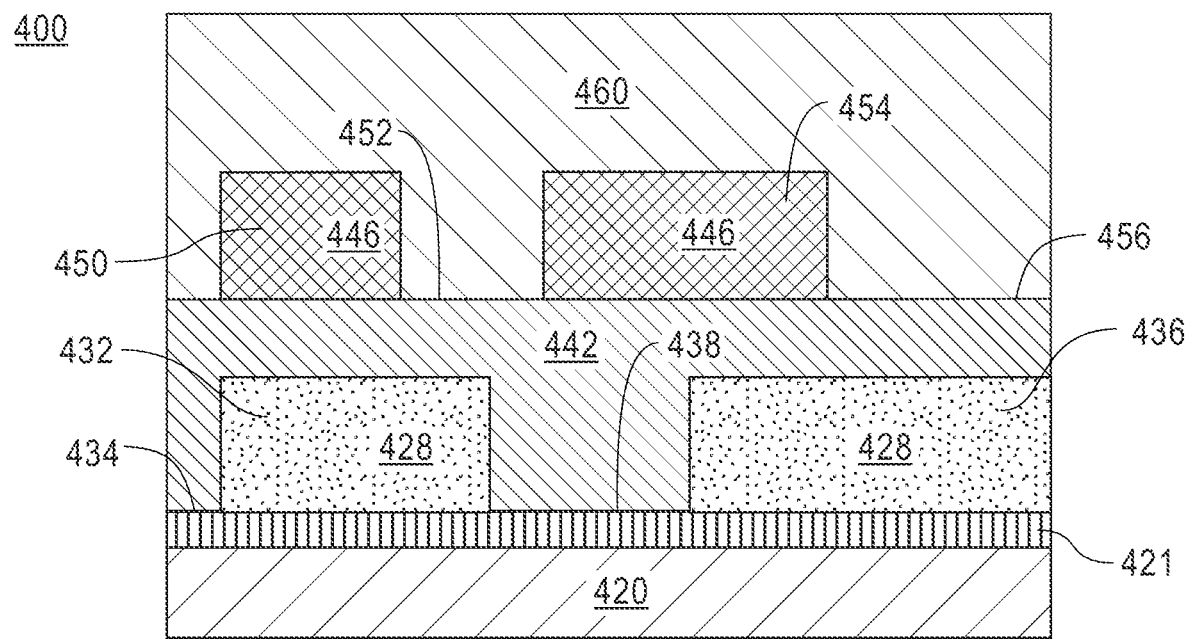
FIG. 12B illustrates a schematic cross-sectional view cut along a second line of the example arrangement shown in FIG. 4 following the performance of the portion of the example method of FIG. 3, in accordance with embodiments of the present disclosure.
Figure 12C:
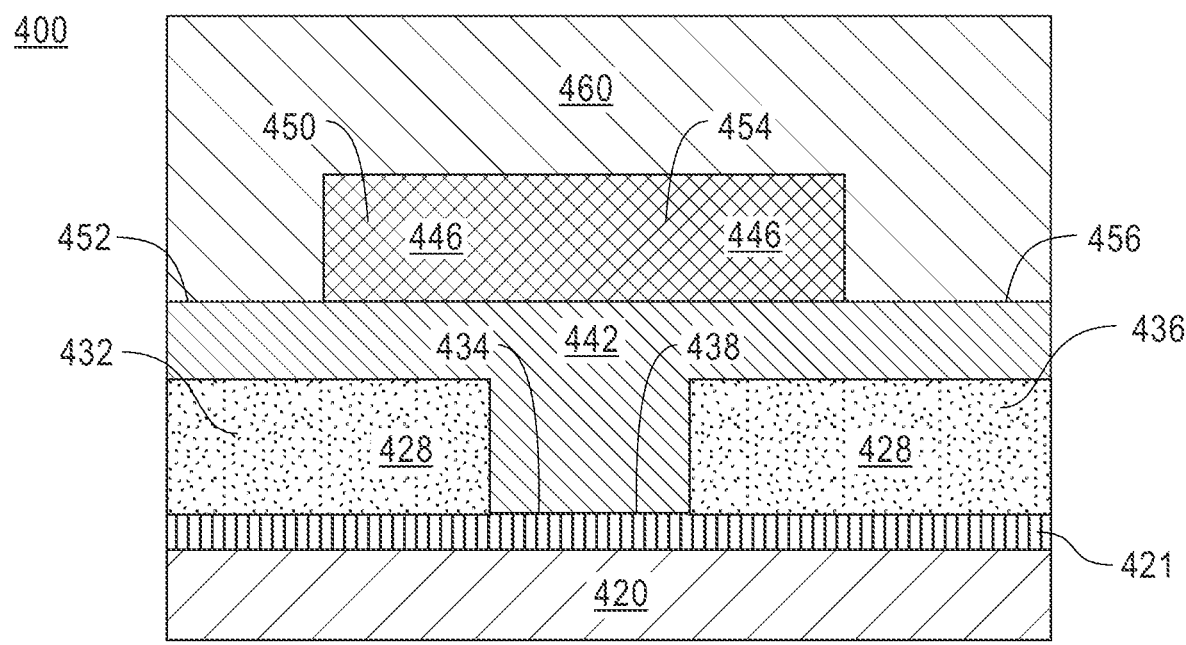
FIG. 12C illustrates a schematic cross-sectional view cut along a second line of the example arrangement shown in FIG. 4 following the performance of the portion of the example method of FIG. 3, in accordance with embodiments of the present disclosure.
Figure 12D:
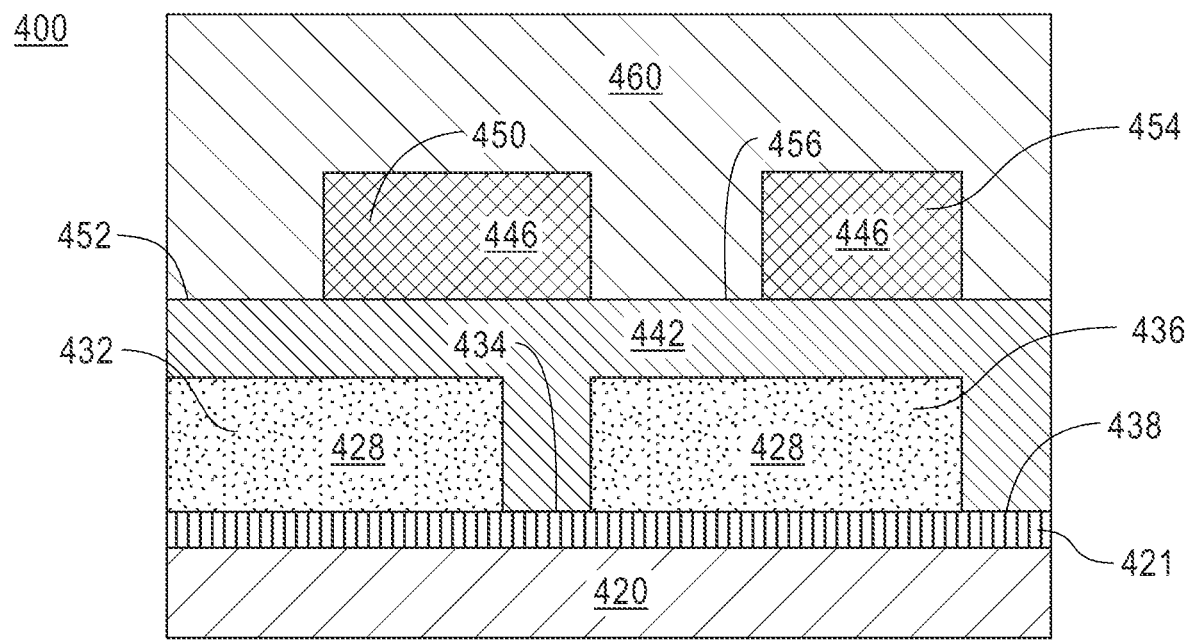
FIG. 12D illustrates a schematic cross-sectional view cut along a second line of the example arrangement shown in FIG. 4 following the performance of the portion of the example method of FIG. 3, in accordance with embodiments of the present disclosure.
Figure 12E:
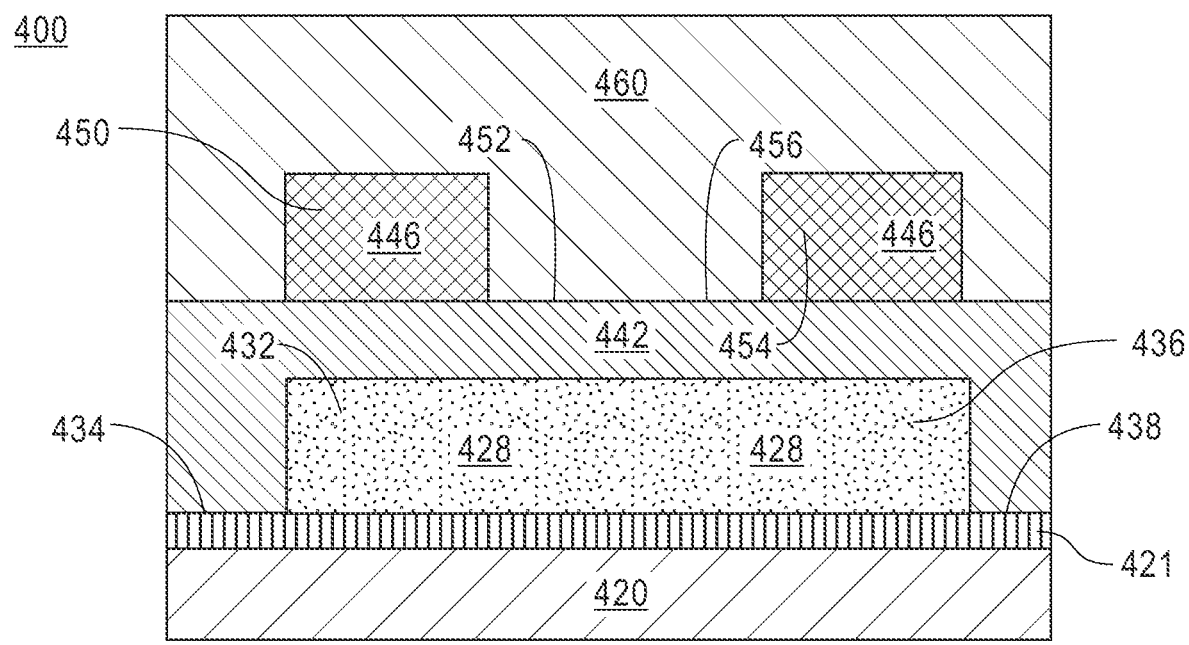
FIG. 12E illustrates a schematic cross-sectional view cut along a second line of the example arrangement shown in FIG. 4 following the performance of the portion of the example method of FIG. 3, in accordance with embodiments of the present disclosure.
Figure 13A:
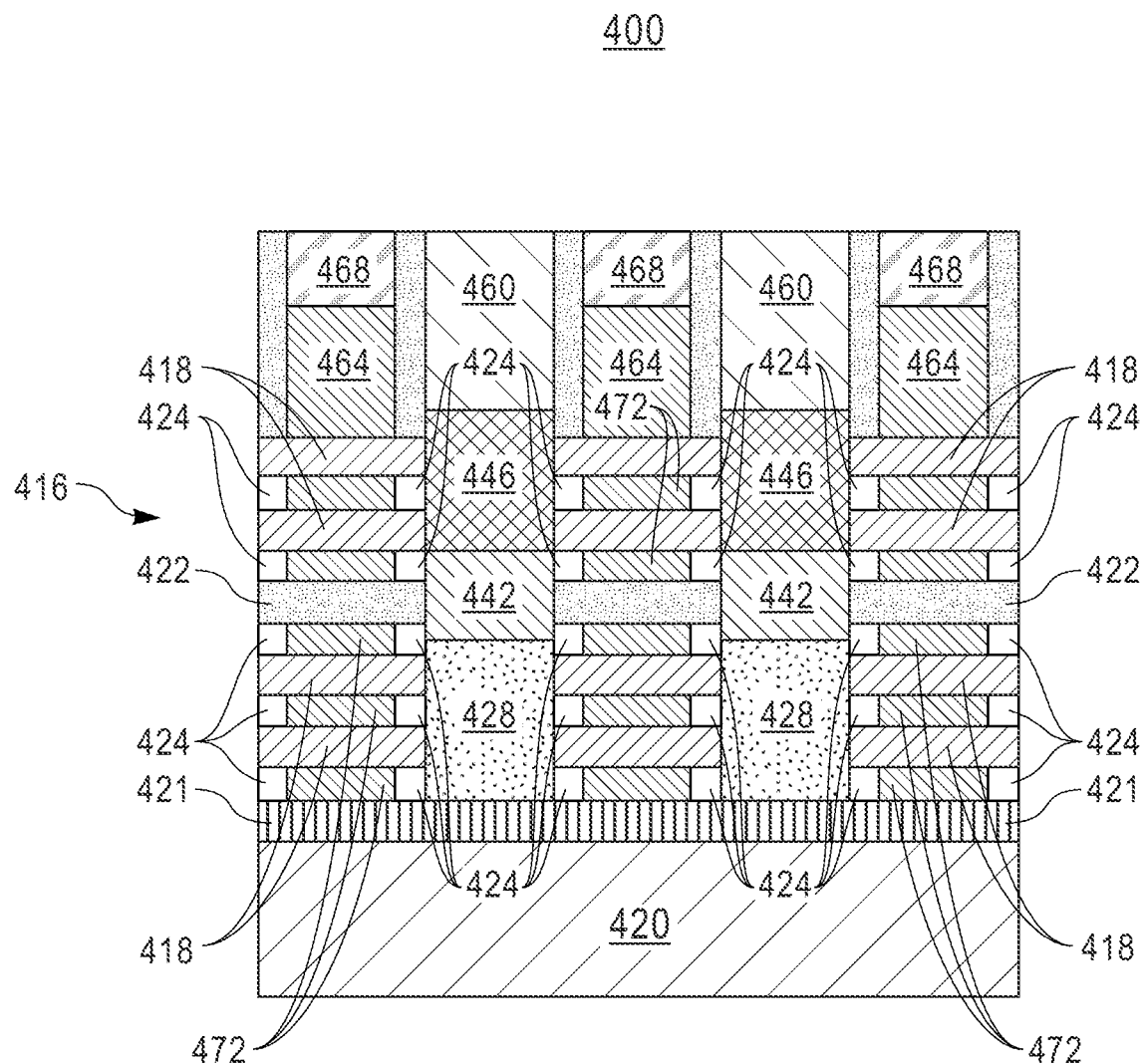
FIG. 13A illustrates a schematic cross-sectional view cut along a first line of the example arrangement shown in FIG. 4 following the performance of the portion of the example method of FIG. 3, in accordance with embodiments of the present disclosure.
Figure 13B:
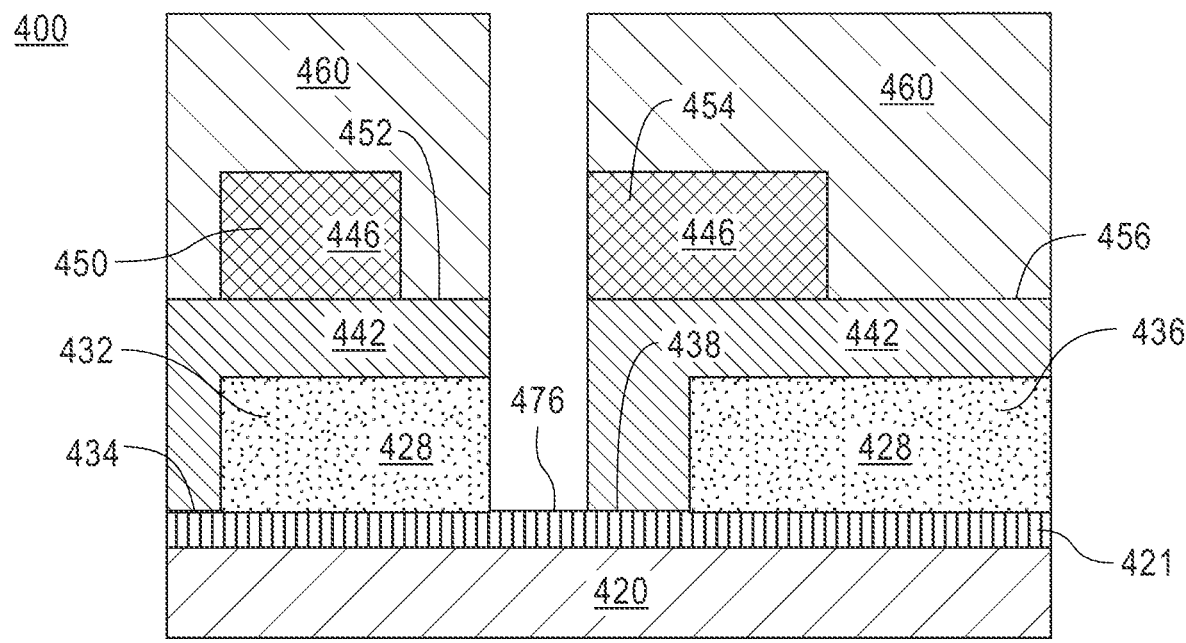
FIG. 13B illustrates a schematic cross-sectional view cut along a second line of the example arrangement shown in FIG. 4 following the performance of the portion of the example method of FIG. 3, in accordance with embodiments of the present disclosure.
Figure 13C:
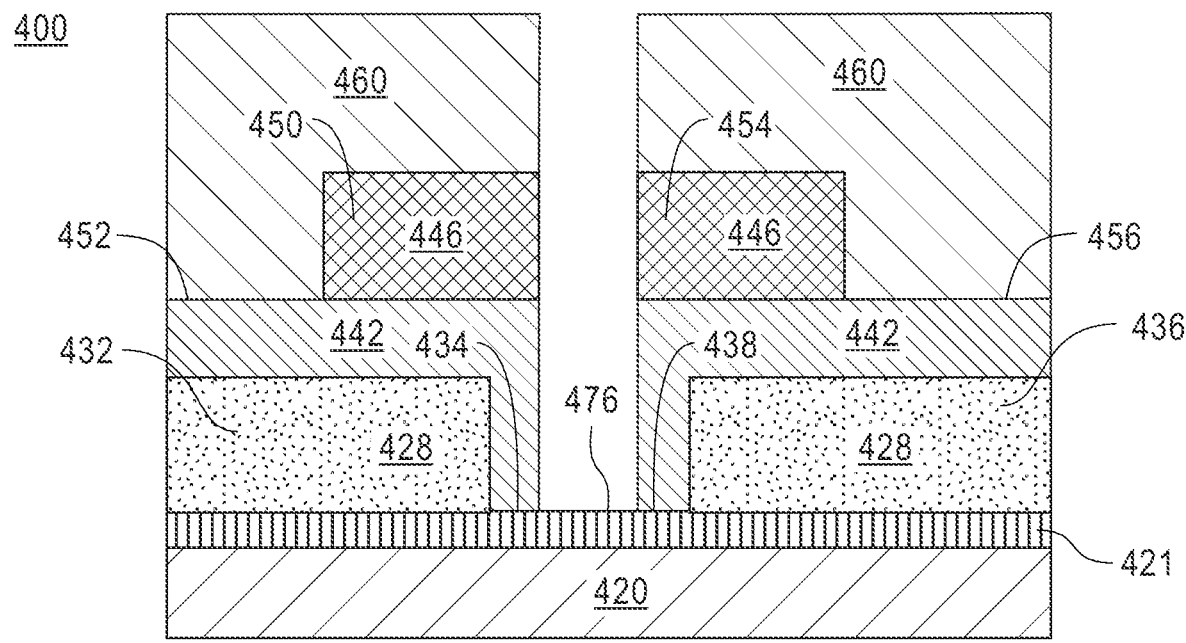
FIG. 13C illustrates a schematic cross-sectional view cut along a second line of the example arrangement shown in FIG. 4 following the performance of the portion of the example method of FIG. 3, in accordance with embodiments of the present disclosure.
Figure 13D:
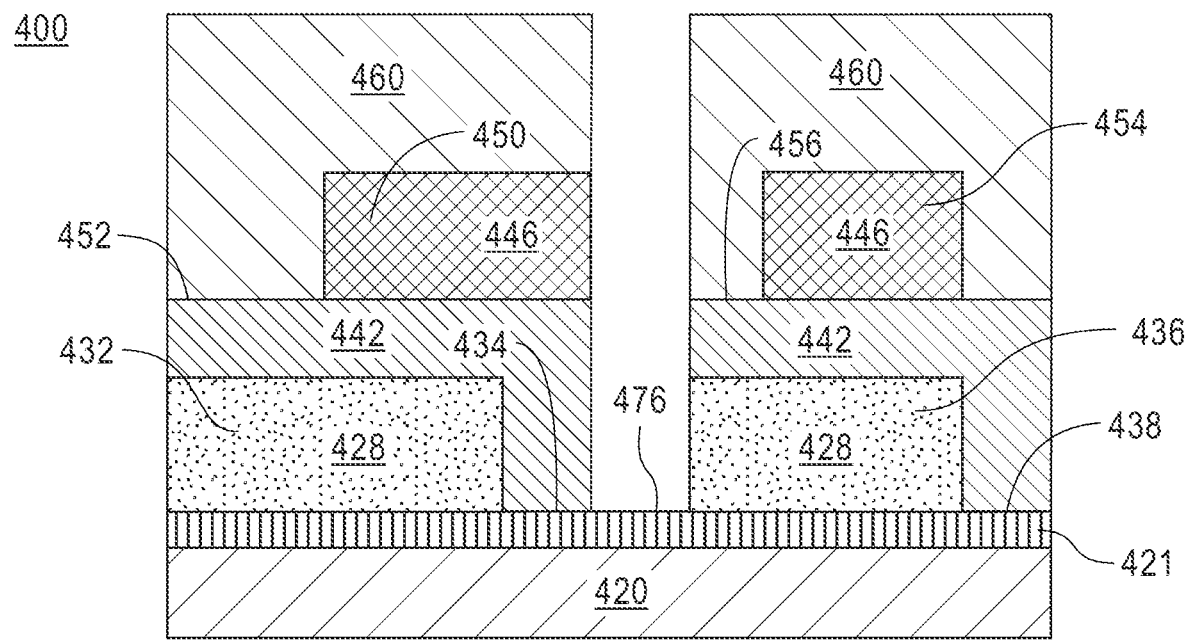
FIG. 13D illustrates a schematic cross-sectional view cut along a second line of the example arrangement shown in FIG. 4 following the performance of the portion of the example method of FIG. 3, in accordance with embodiments of the present disclosure.
Figure 13E:
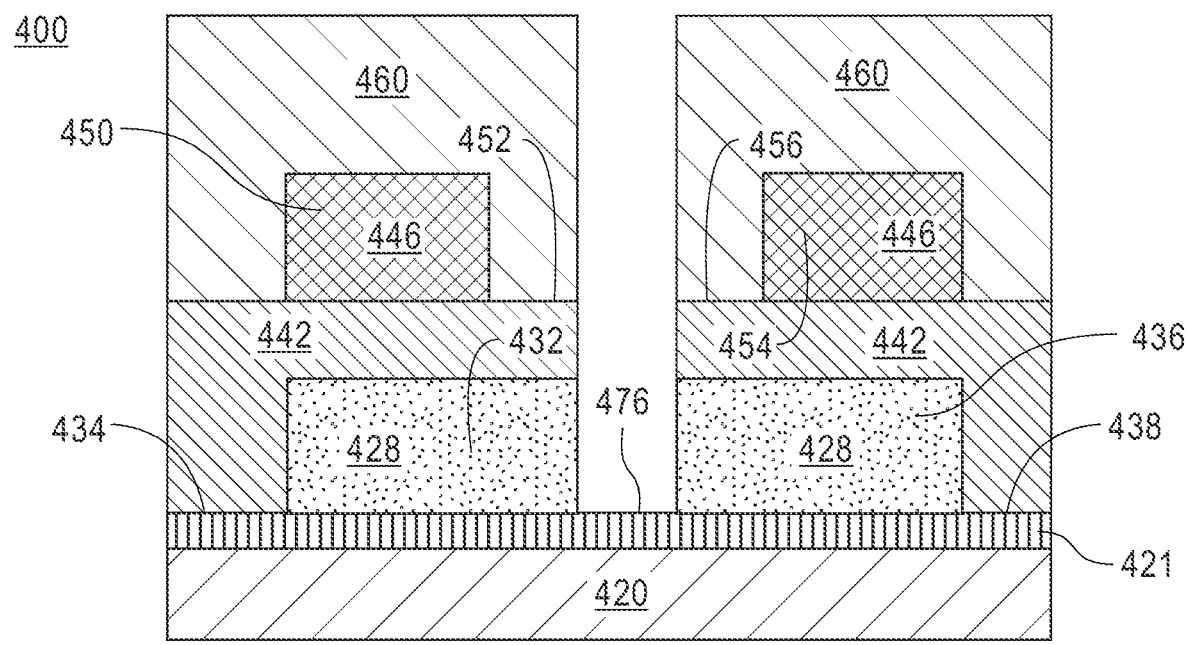
FIG. 13E illustrates a schematic cross-sectional view cut along a second line of the example arrangement shown in FIG. 4 following the performance of the portion of the example method of FIG. 3, in accordance with embodiments of the present disclosure.
Figure 14A:
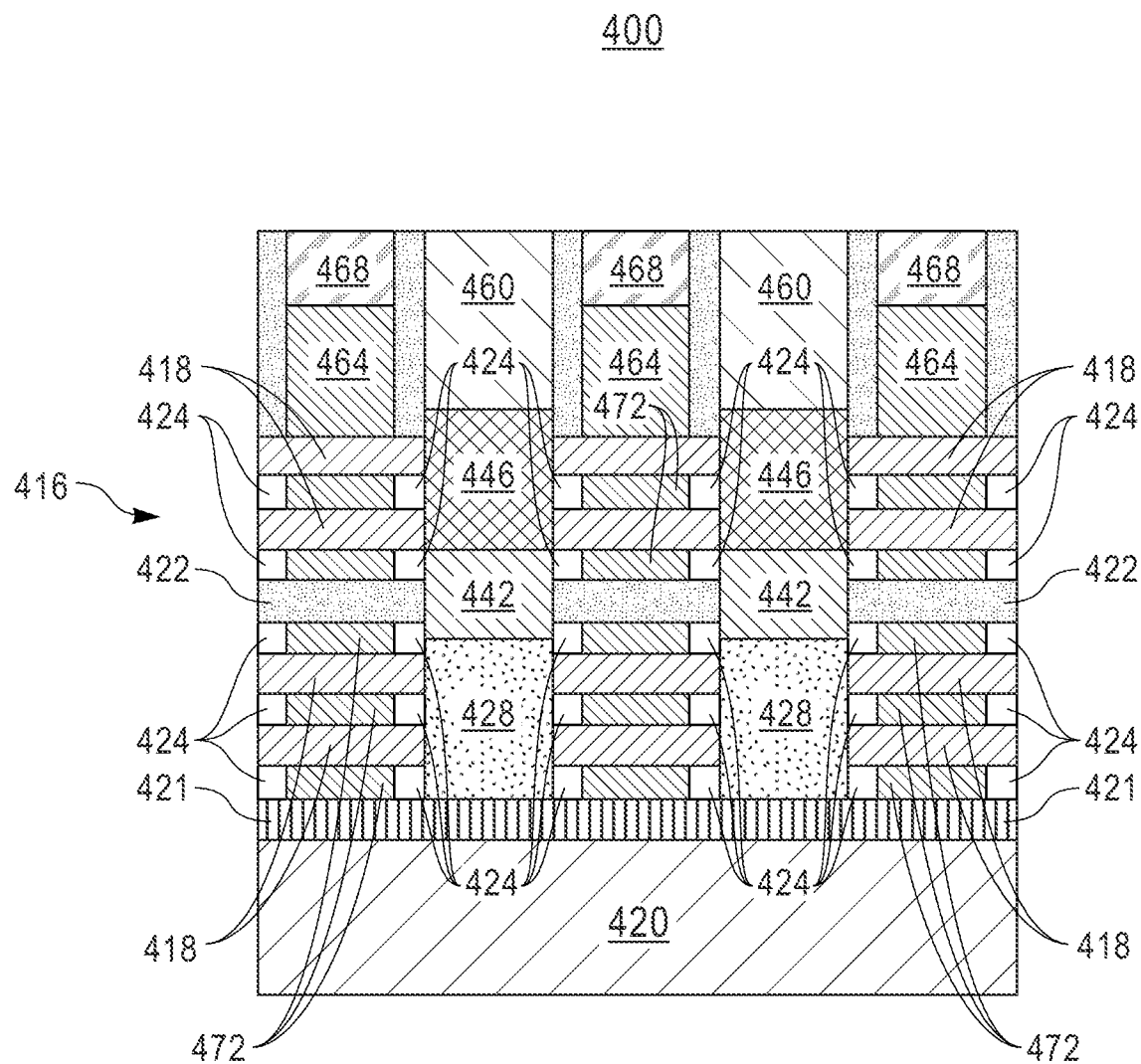
FIG. 14A illustrates a schematic cross-sectional view cut along a first line of the example arrangement shown in FIG. 4 following the performance of the portion of the example method of FIG. 3, in accordance with embodiments of the present disclosure.
Figure 14B:
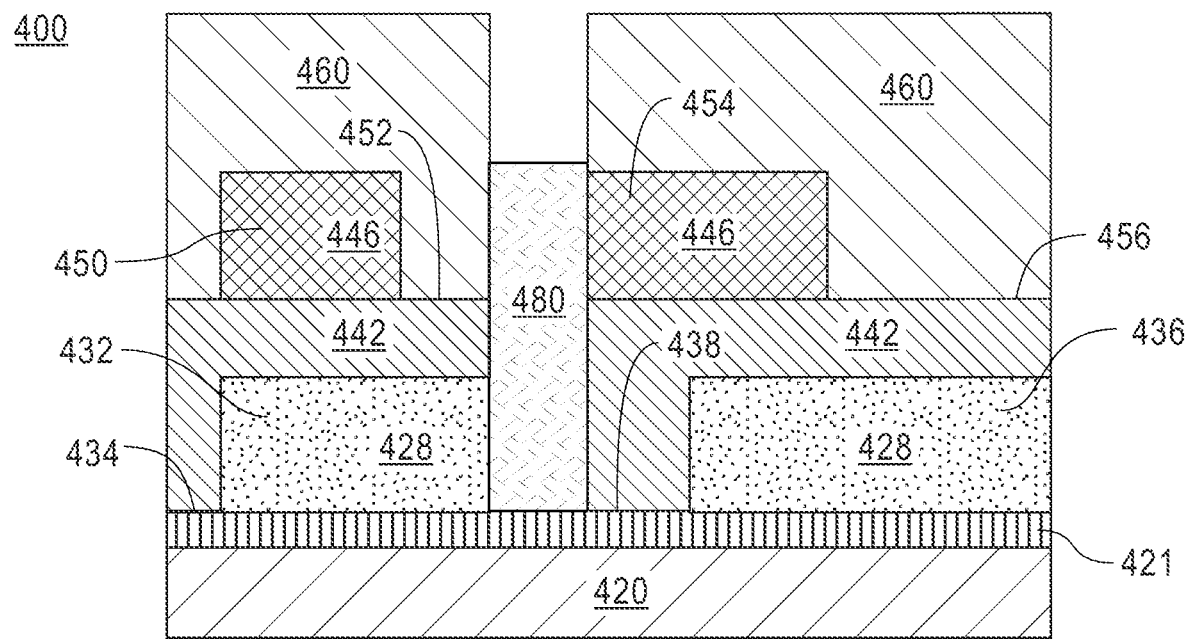
FIG. 14B illustrates a schematic cross-sectional view cut along a second line of the example arrangement shown in FIG. 4 following the performance of the portion of the example method of FIG. 3, in accordance with embodiments of the present disclosure.
Figure 14C:
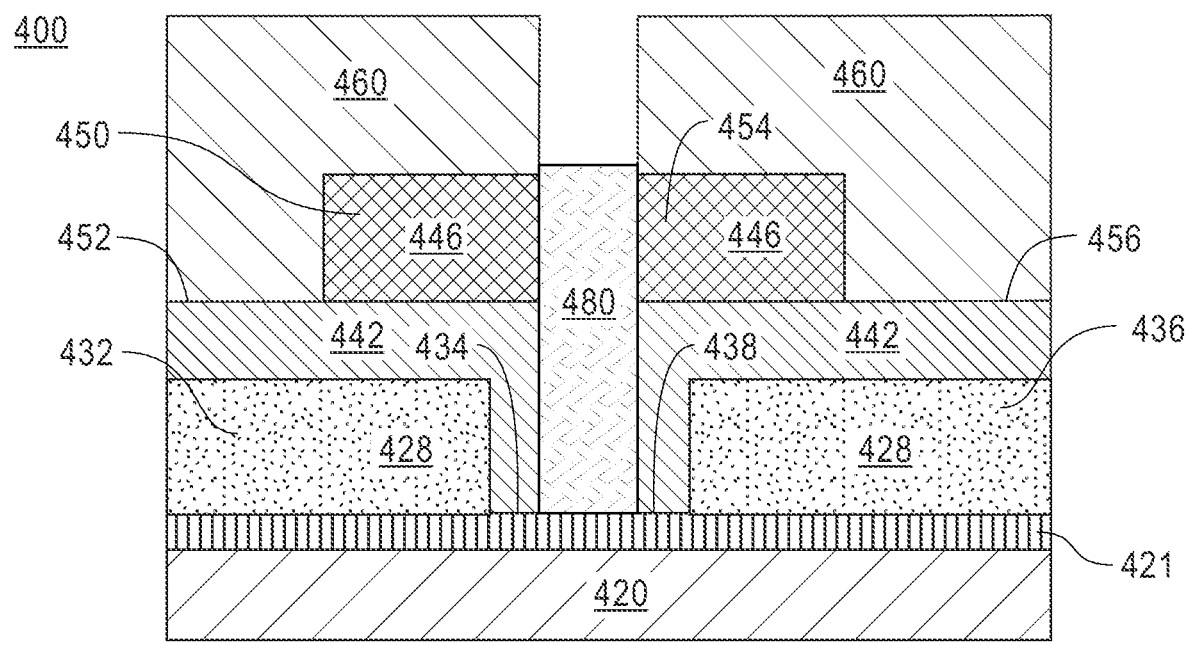
FIG. 14C illustrates a schematic cross-sectional view cut along a second line of the example arrangement shown in FIG. 4 following the performance of the portion of the example method of FIG. 3, in accordance with embodiments of the present disclosure.
Figure 14D:
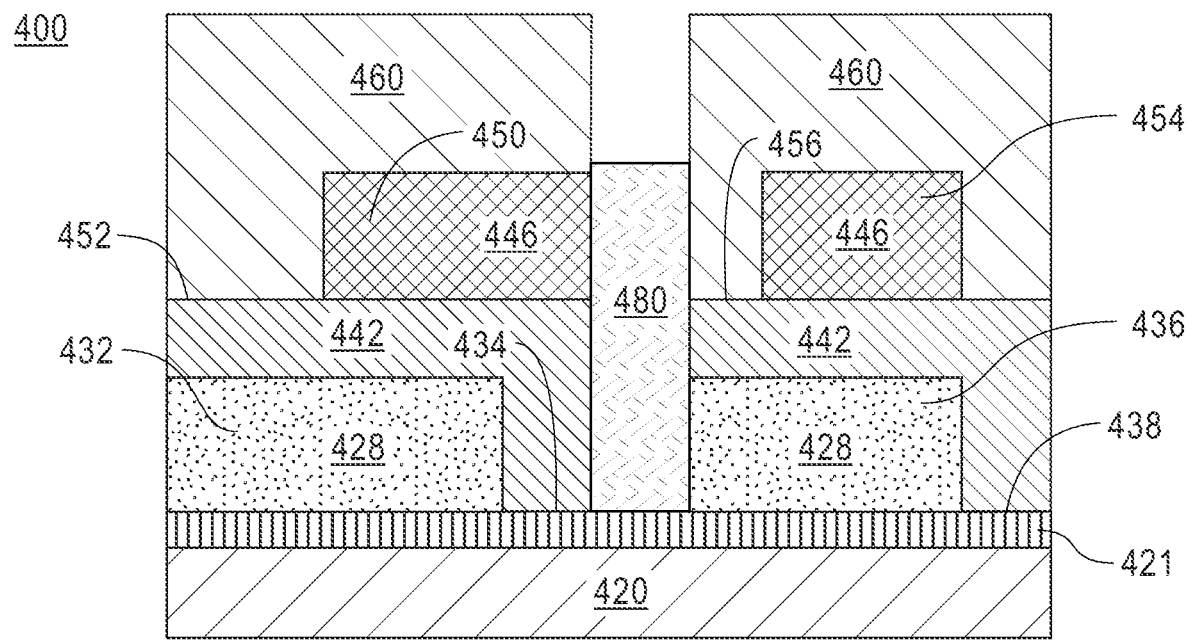
FIG. 14D illustrates a schematic cross-sectional view cut along a second line of the example arrangement shown in FIG. 4 following the performance of the portion of the example method of FIG. 3, in accordance with embodiments of the present disclosure.
Figure 14E:
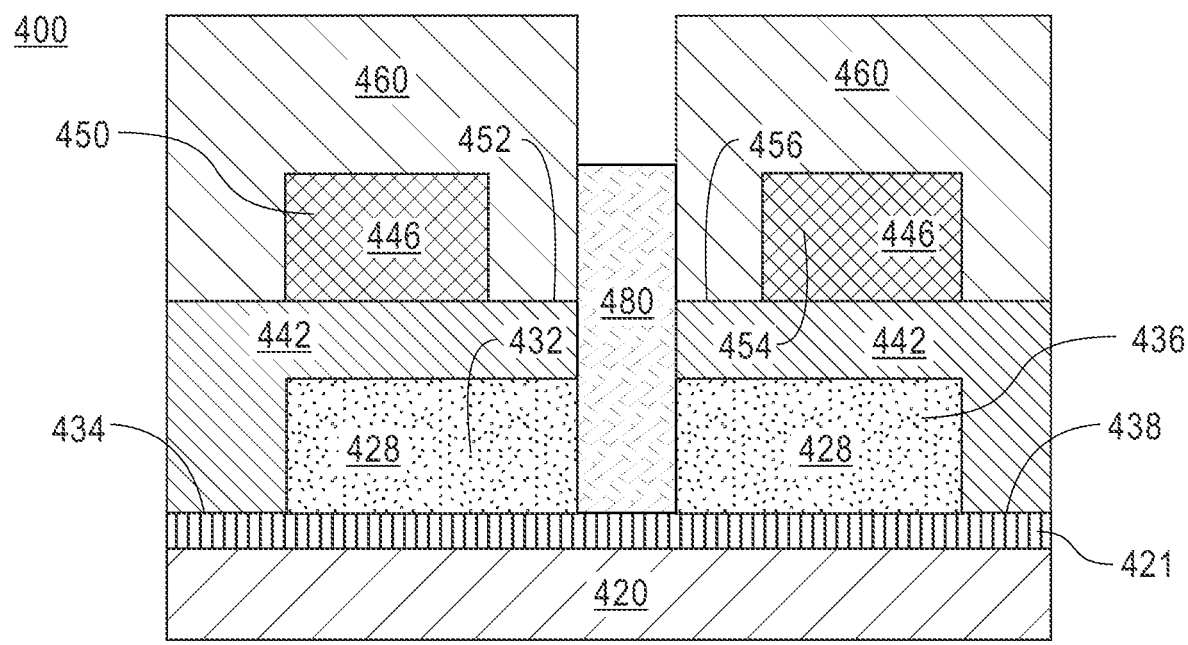
FIG. 14E illustrates a schematic cross-sectional view cut along a second line of the example arrangement shown in FIG. 4 following the performance of the portion of the example method of FIG. 3, in accordance with embodiments of the present disclosure.

FIGS. 12A-12E depict the example structure 400 following the performance of these sub-operations of operation 312. (FIGS. 12A-12E depict the same views of the example structure 400 as FIGS. 7A-7E.) Accordingly, as shown in FIG. 12A, the dummy gates 412 (shown in FIG. 11A) have been replaced with HKMGs 464 and gate dielectric caps 468. Additionally, the silicon germanium layers 417 of the nanosheet stacks 416 (shown in FIG. 11A) have also been replaced with HKMG 472.

In accordance with at least one embodiment of the present disclosure, the performance of operation 312 includes patterning and forming the trench such that the trench is formed between the first area and the second area and between the third area and the fourth area.

FIGS. 13A-13E depict the example structure 400 following the performance of these sub-operations of operation 312. (FIGS. 13A-13E depict the same views of the example structure 400 as FIGS. 7A-7E.) As shown, in FIGS. 13B-13E, in all embodiments, the trench 476 is formed between the first region 432 of epitaxy material and the second region 436 of epitaxy material and is formed between the third region 450 of epitaxy material and the fourth region 454 of epitaxy material. In other words, the trench 476 is formed between the first area and the second area of the first layer of epitaxy material and between the third area and the fourth area of the second layer of epitaxy material. Accordingly, the trench 476 separates lower FETs from one another and separates upper FETs from one another.

Returning to FIG. 3, at operation 316 of the method 300, a contact is formed in the trench. More specifically, the contact is an interconnect and is formed so as to be in direct contact with one of the first area and the third area and so as to be in direct contact with one of the second area and the fourth area. The contact formed by the performance of operation 316 is a local buried interconnect.

In accordance with at least one embodiment of the present disclosure, forming the contact includes forming the contact such that the contact does not extend above the second layer of epitaxy material. In accordance with at least one embodiment of the present disclosure, forming the contact can include metallizing the trench. In accordance with at least one embodiment of the present disclosure, forming the contact layer can include recessing the contact.

FIGS. 14A-14E depict the example structure 400 following the performance of operation 316. (FIGS. 14A-14E depict the same views of the example structure 400 as FIGS. 7A-7E.) As shown in FIGS. 14B-14E, a contact 480 has been formed in the trench 476 (shown in FIGS. 13B-13E) such that the contact 480 is in direct contact with one of the first region 432 of epitaxy material and the third region 450 of epitaxy material and is in direct contact with one of the second region 436 and the fourth region 454 of epitaxy material. More specifically, in the embodiment shown in FIG. 14B, the contact 480 is in direct contact with the first region 432 and the fourth region 454 of epitaxy material. In the embodiment shown in FIG. 14C, the contact 480 is in direct contact with the third region 450 and the fourth region 454 of epitaxy material. In the embodiment shown in FIG. 14D, the contact 480 is in direct contact with the third region 450 and the of second region 436 epitaxy material. In the embodiment shown in FIG. 14E, the contact 480 is in direct contact with the first region 432 and the second region 436 of epitaxy material.

In accordance with at least one embodiment of the present disclosure, the contact 480 is formed by firstly depositing a silicide liner, such as Ti, Ni, or NiPt, followed by a metal adhesion layer, such as TiN or TaN, followed by a low-resistance metal fill, such as Ru, W, Al, Cu, or Co, and then performing metal CMP and metal recess procedures.

Returning to FIG. 3, at operation 320 of the method 300, the CFET arrangement is finalized. In accordance with embodiments of the present disclosure, the performance of operation 320 may include the performance of one or more sub-operations.

In accordance with at least one embodiment of the present disclosure, the performance of operation 320 includes functionally interconnecting the first area and the third area to form a first CMOS cell and functionally interconnecting the second area and the fourth area to form a second CMOS cell.

In accordance with at least one embodiment of the present disclosure, the performance of operation 320 includes forming a first further contact in direct contact with the other one of the first area and the third area. In other words, the first further contact is formed in direct contact with the one of the first area and the third area that is not in direct contact with the local buried interconnect. In such embodiments, the performance of operation 316 can include forming the contact in the trench such that the contact does not extend as high as the first further contact.

In accordance with at least one embodiment of the present disclosure, the performance of operation 320 includes forming a second further contact in direct contact with the other one of the second area and the fourth area. In other words, the second further contact is formed in direct contact with the one of the second area and the fourth area that is not in direct contact with the local buried interconnect. In such embodiments, the performance of operation 316 can include forming the contact in the trench such that the contact does not extend as high as the second further contact.

In accordance with at least one embodiment of the present disclosure, the performance of operation 320 includes forming a dielectric cap on top of the local buried interconnect to isolate the local buried interconnect.

FIGS. 15A-15E depict the example structure 400 following the performance of operation 320. (FIGS. 15A-15E depict the same views of the example structure 400 as FIGS. 7A-7E.) As shown, in FIGS. 15B-15E, a first further contact 484 has been formed in direct contact with the one of the first region 432 and the third region 450 of epitaxy material that is not in direct contact with the contact 480, and a second further contact 488 has been formed in direct contact with the one of the second region 436 and the fourth region 454 of epitaxy material that is not in direct contact with the contact 480.

Figure 15A:
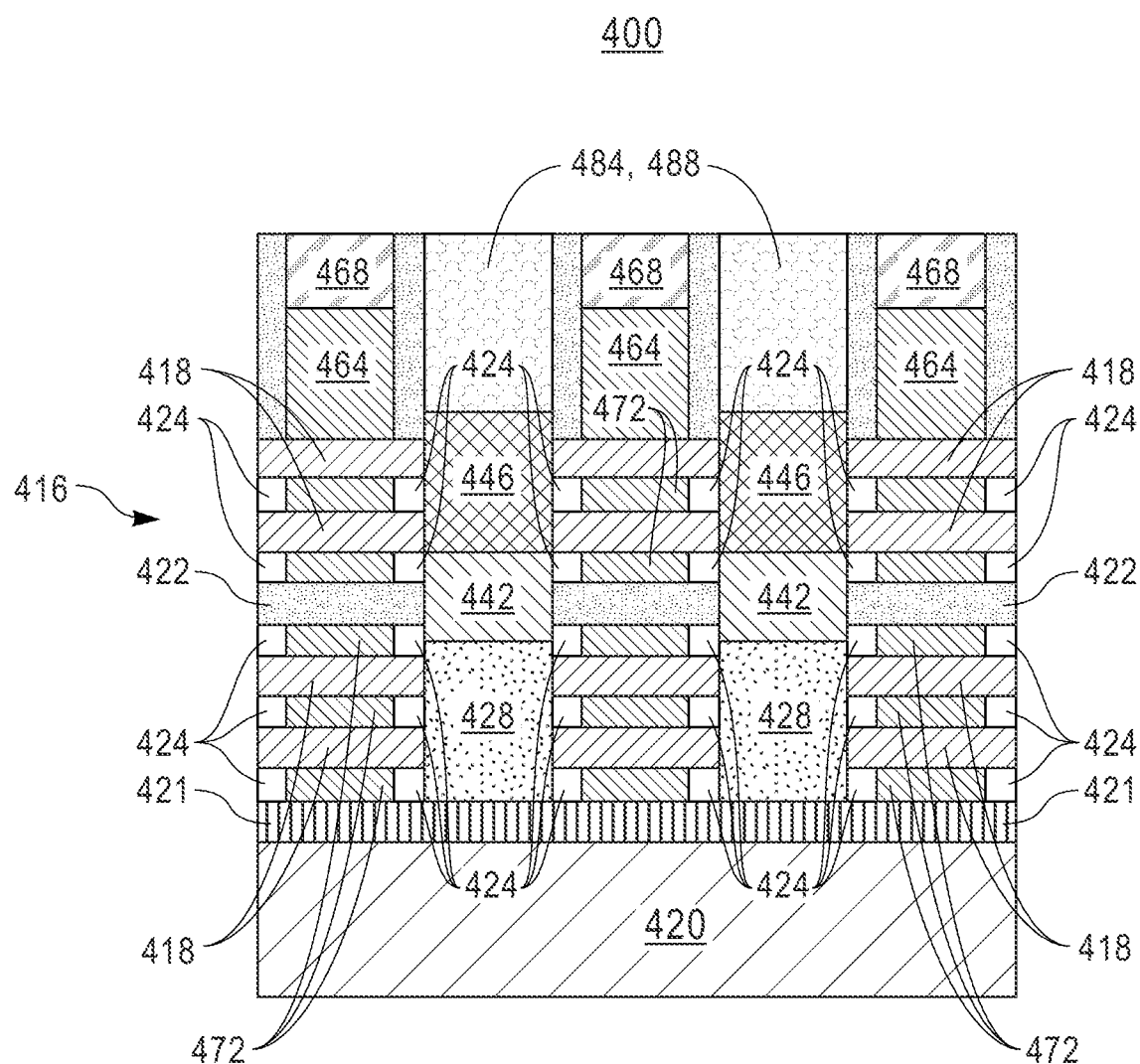
FIG. 15A illustrates a schematic cross-sectional view cut along a first line of the example arrangement shown in FIG. 4 following the performance of the portion of the example method of FIG. 3, in accordance with embodiments of the present disclosure.
Figure 15B:
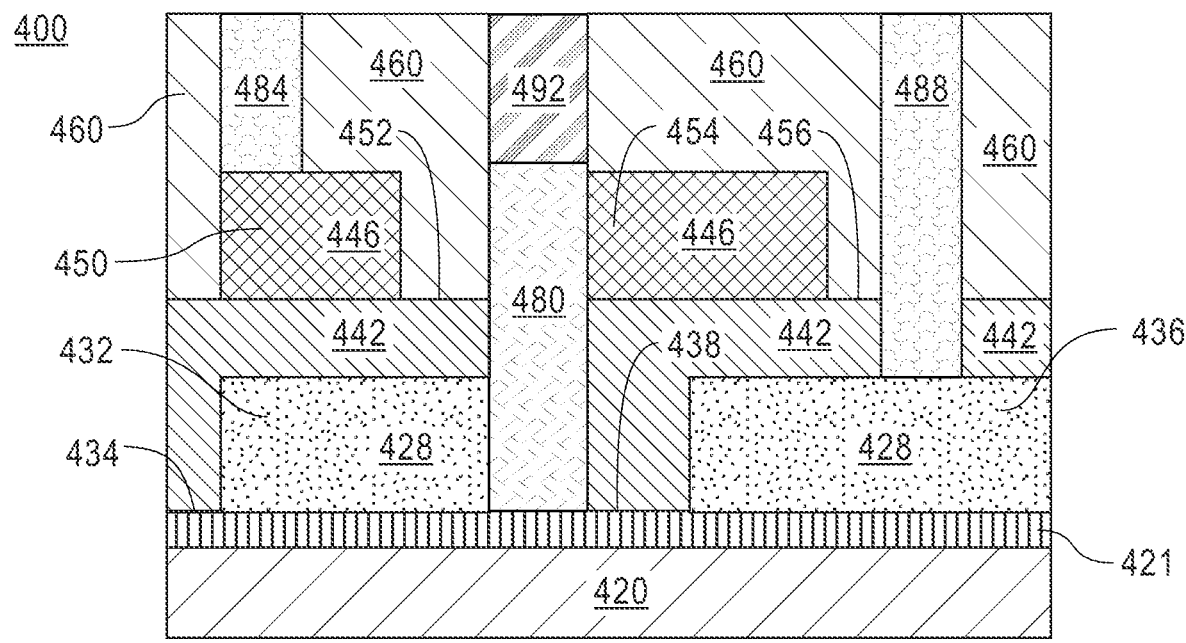
FIG. 15B illustrates a schematic cross-sectional view cut along a second line of the example arrangement shown in FIG. 4 following the performance of the portion of the example method of FIG. 3, in accordance with embodiments of the present disclosure.
Figure 15C:
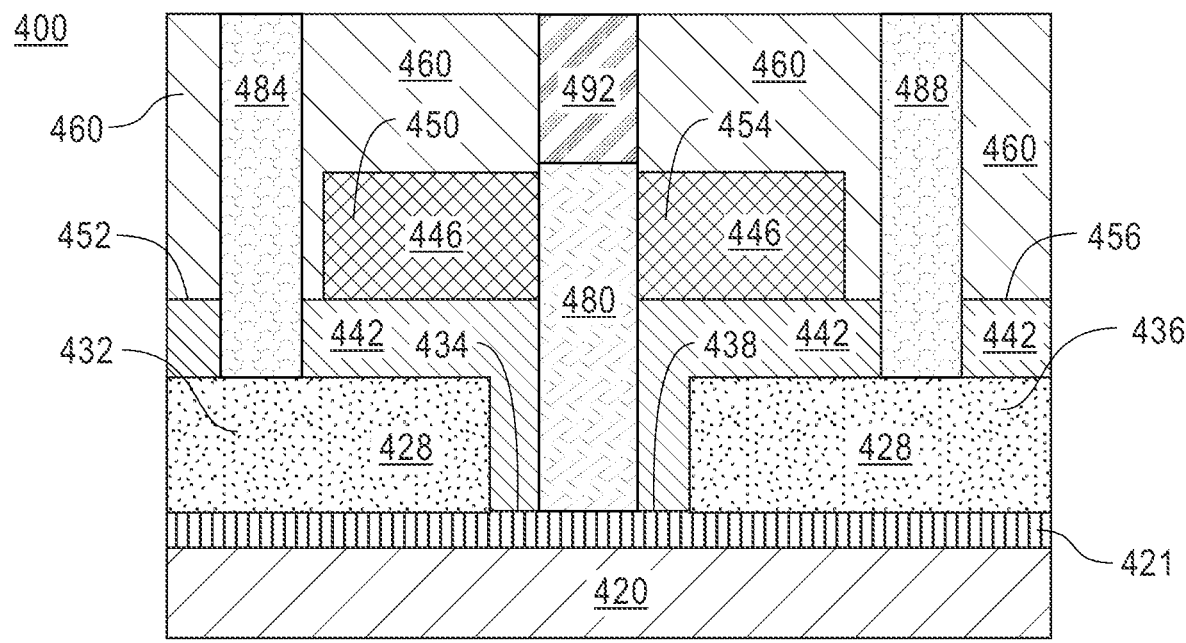
FIG. 15C illustrates a schematic cross-sectional view cut along a second line of the example arrangement shown in FIG. 4 following the performance of the portion of the example method of FIG. 3, in accordance with embodiments of the present disclosure.
Figure 15D:
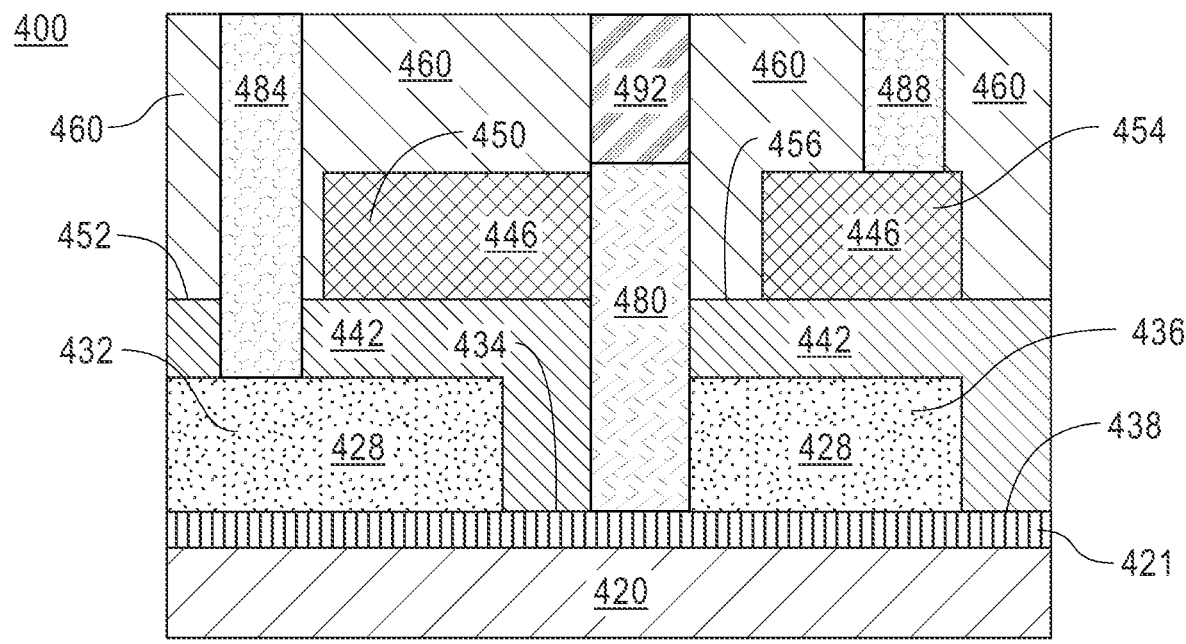
FIG. 15D illustrates a schematic cross-sectional view cut along a second line of the example arrangement shown in FIG. 4 following the performance of the portion of the example method of FIG. 3, in accordance with embodiments of the present disclosure.
Figure 15E:
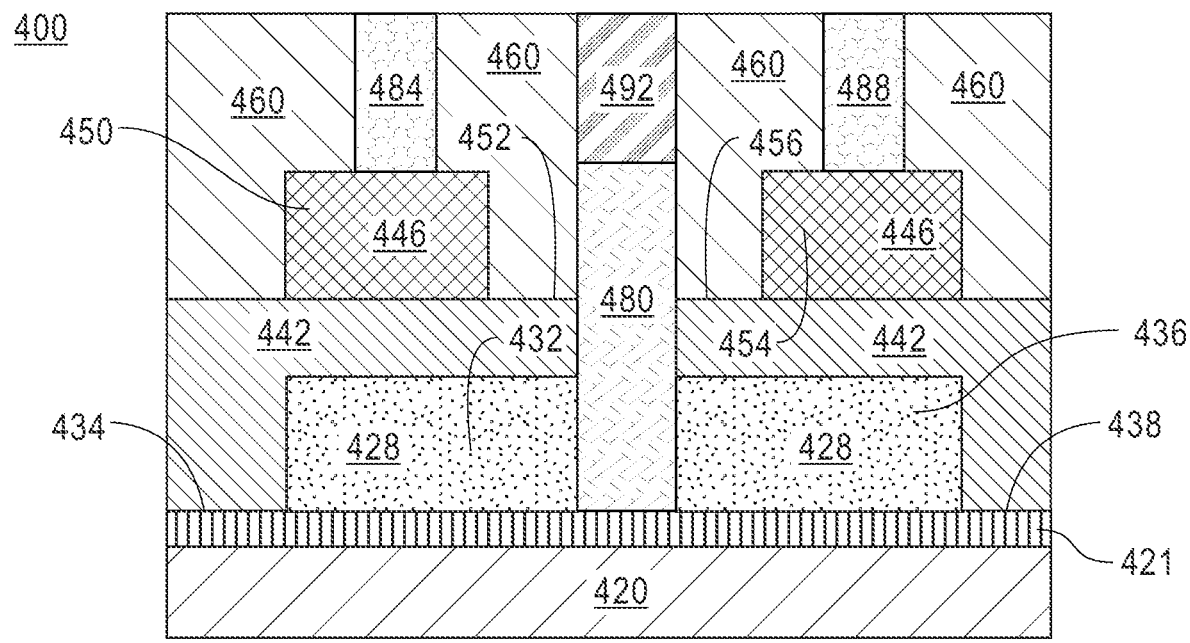
FIG. 15E illustrates a schematic cross-sectional view cut along a second line of the example arrangement shown in FIG. 4 following the performance of the portion of the example method of FIG. 3, in accordance with embodiments of the present disclosure.

More specifically, in the embodiment shown in FIG. 15B, the first further contact 484 has been formed in direct contact with the third region 450 of epitaxy material and the second further contact 488 has been formed in direct contact with the second region 436 of epitaxy material. In the embodiment shown in FIG. 15C, the first further contact 484 has been formed in direct contact with the first region 432 of epitaxy material, and the second further contact 488 has been formed in direct contact with the second region 436 of epitaxy material. In the embodiment shown in FIG. 15D, the first further contact 484 has been formed in direct contact with the first region 432 of epitaxy material, and the second further contact 488 has been formed in direct contact with the fourth region 454 of epitaxy material. In the embodiment shown in FIG. 15E, the first further contact 484 has been formed in direct contact with the third region 450 of epitaxy material, and the second further contact 488 has been formed in direct contact with the fourth region 454 of epitaxy material.

Additionally, as shown in FIGS. 15B-15E, the contact 480 has been isolated by a dielectric cap 492.

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. An integrated circuit component, comprising:
    a first layer including a first area of epitaxy material and a second area of epitaxy material, the first layer having a first polarity;
    a second layer including a third area of epitaxy material and a fourth area of epitaxy material, the second layer having a second polarity that is different than the first polarity, the third area of epitaxy material arranged at least partially above the first area of epitaxy material, and the fourth area of epitaxy material arranged at least partially above the second area of epitaxy material; and
    an interconnect in direct contact with one of the first area and the third area of epitaxy material and in direct contact with one of the second area and the fourth area of epitaxy material, the interconnect having a top surface that does not extend substantially above an uppermost surface of the second layer.

2. The integrated circuit component of claim 1, wherein the top surface of the interconnect is substantially coplanar with the uppermost surface of the second layer.

3. The integrated circuit component of claim 1, wherein:
    the first area of epitaxy material corresponds to a first field-effect transistor,
    the second area of epitaxy material corresponds to a second field-effect transistor,
    the third area of epitaxy material corresponds to a third field-effect transistor, and
    the fourth area of epitaxy material corresponds to a fourth field-effect transistor.

4. The integrated circuit component of claim 3, wherein:
    the first field-effect transistor and the third field-effect transistor make up a first complementary metal-oxide-semiconductor; and
    the second field-effect transistor and the fourth field-effect transistor make up a second complementary metal-oxide-semiconductor.

5. The integrated circuit component of claim 1, wherein the interconnect has a bottom surface that does not extend below a lowermost surface of the first layer.

6. The integrated circuit component of claim 5, wherein the bottom surface of the interconnect is substantially coplanar with the lowermost surface of the first layer.

7. The integrated circuit component of claim 1, wherein:
    the interconnect has a first side surface extending from the bottom surface to the top surface,
    the interconnect has a second side surface extending from the bottom surface to the top surface,
    the first side surface is in direct contact with the one of the first area and the third area of epitaxy material, and
    the second side surface is in direct contact with the one of the second area and the fourth area of epitaxy material.

8. The integrated circuit component of claim 7, wherein the first side surface is arranged opposite the second side surface.

9. A method of making an integrated circuit component, the method comprising:
   forming a first layer of epitaxy material, the first layer including a first area and a second area;
   forming a second layer of epitaxy material, the second layer including a third area arranged at least partially above the first area and a fourth area arranged at least partially above the second area;
   forming a trench between the first area and the second area and between the third area and the fourth area such that the trench extends through an entire thickness of the first layer of epitaxy material; and
   forming a contact in the trench such that the contact is in direct contact with one of the first area and the third area and is in direct contact with one of the second area and the fourth area.

10. The method of claim 9, wherein:
    forming the contact includes forming the contact such that the contact does not extend above the second layer.

11. The method of claim 9, further comprising:
    forming a first further contact in direct contact with the other one of the first area and the third area,
    wherein forming the contact in the trench includes forming the contact such that the contact does not extend above the first further contact.

12. The method of claim 9, further comprising:
    forming a second further contact in direct contact with the other one of the second area and the fourth area,
    wherein forming the contact in the trench includes forming the contact such that the contact does not extend above the second further contact.

13. The method of claim 9, wherein:
    the first layer of epitaxy material has a first polarity, and
    the second layer of epitaxy material has a second polarity different than the first polarity.

14. The method of claim 13, wherein:
    forming the first layer of epitaxy material includes patterning the first layer such that the first area includes a first channel region and such that the second area includes a second channel region; and
    forming the second layer of epitaxy material includes patterning the second layer such that the third area includes a third channel region and such that the fourth area includes a fourth channel region.

15. The method of claim 14, further comprising:
    functionally interconnecting the first area and the third area to form a first complementary metal-oxide semiconductor cell; and
    functionally interconnecting the second area and the fourth area to form a second complementary metal-oxide semiconductor cell.

16. An integrated circuit component, comprising:
    a first layer of field-effect transistors having a first polarity;
    a second layer of field-effect transistors stacked on top of the first layer of field-effect transistors, the second layer of field-effect transistors having a second polarity that is different than the first polarity; and
    an interconnect in direct contact with one of the field-effect transistors of the first layer and in direct contact with one of the field-effect transistors of the second layer, wherein the interconnect does not extend above the second layer of field-effect transistors.

17. The integrated circuit component of claim 16, wherein:
    the interconnect has a top surface that is substantially coplanar with an uppermost surface of the second layer.

18. The integrated circuit component of claim 16, wherein:
    the first layer includes a first field-effect transistor and includes a second field-effect transistor,
    the second layer includes a third field-effect transistor arranged at least partially above the first field-effect transistor and includes a fourth field-effect transistor arranged at least partially above the second field-effect transistor.

19. The integrated circuit component of claim 18, wherein:
    the first field-effect transistor and the third field-effect transistor make up a first complementary metal-oxide-semiconductor, and
    the second field-effect transistor and the fourth field-effect transistor make up a second complementary metal-oxide-semiconductor.

20. The integrated circuit component of claim 18, wherein:
    the interconnect is in direct contact with one of the first field-effect transistor and the third field-effect transistor and with one of the second field-effect transistor and the fourth field-effect transistor.

* * * * *